(12) United States Patent
Dehe

(10) Patent No.: US 10,927,002 B2
(45) Date of Patent: Feb. 23, 2021

(54) MEMBRANE COMPONENTS AND METHOD FOR FORMING A MEMBRANE COMPONENT

(71) Applicant: Infineon Technologies AG, Neubiberg (DE)

(72) Inventor: Alfons Dehe, Villingen Schwenningen (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 87 days.

(21) Appl. No.: 16/402,632

(22) Filed: May 3, 2019

(65) Prior Publication Data
US 2019/0256351 A1    Aug. 22, 2019

Related U.S. Application Data

(62) Division of application No. 15/885,401, filed on Jan. 31, 2018, now Pat. No. 10,336,607.

(30) Foreign Application Priority Data
Feb. 3, 2017    (DE) .......................... 102017102190.6

(51) Int. Cl.
*H01L 29/82* (2006.01)
*B81C 1/00* (2006.01)
(Continued)

(52) U.S. Cl.
CPC ........ *B81C 1/00158* (2013.01); *B81B 3/0005* (2013.01); *H04R 19/04* (2013.01);
(Continued)

(58) Field of Classification Search
CPC ............ B81C 1/00158; B81C 1/00182; H01L 2924/1461; H01L 41/1138;
(Continued)

(56) References Cited

U.S. PATENT DOCUMENTS 6,787,052 B1    9/2004    Vaganov
6,859,542 B2    2/2005    Johannsen et al.
(Continued)

FOREIGN PATENT DOCUMENTS

DE    19718370 A1    11/1997
DE    10003066 A1    8/2000

*Primary Examiner* — Theresa T Doan
(74) *Attorney, Agent, or Firm* — Slater Matsil, LLP

(57) ABSTRACT

A membrane component comprises a membrane structure comprising an electrically conductive membrane layer. The electrically conductive membrane layer has a suspension region and a membrane region. In addition, the suspension region of the electrically conductive membrane layer is arranged on an insulation layer. Furthermore, the insulation layer is arranged on a carrier substrate. Moreover, the membrane component comprises a counterelectrode structure. A cavity is arranged vertically between the counterelectrode structure and the membrane region of the electrically conductive membrane layer. In addition, an edge of the electrically conductive membrane layer projects laterally beyond an edge of the insulation layer by more than half of a vertical distance between the electrically conductive membrane layer and the counterelectrode structure.

9 Claims, 16 Drawing Sheets

(51) Int. Cl.
  *B81B 3/00* (2006.01)
  *H04R 19/04* (2006.01)
  *H04R 7/10* (2006.01)

(52) U.S. Cl.
  CPC .............. *B81B 2201/0235* (2013.01); *B81B 2201/0257* (2013.01); *B81B 2201/0264* (2013.01); *B81B 2203/0127* (2013.01); *B81B 2203/0315* (2013.01); *B81B 2203/04* (2013.01); *H04R 7/10* (2013.01); *H04R 2201/003* (2013.01)

(58) Field of Classification Search
  CPC .... B81B 2203/0127; B81B 2201/0235; B81B 7/0048; B81B 2203/0315; B81B 2203/04
  USPC ........................................................ 257/419
  See application file for complete search history.

(56) References Cited

U.S. PATENT DOCUMENTS

| | | | |
|---|---|---|---|
| 2002/0181725 | A1 | 12/2002 | Johannsen et al. |
| 2006/0291674 | A1 | 12/2006 | Gong et al. |
| 2007/0023890 | A1 | 2/2007 | Haluzak et al. |
| 2008/0175418 | A1 | 7/2008 | Zhang et al. |
| 2008/0232615 | A1 | 9/2008 | Song et al. |
| 2010/0044808 | A1 | 2/2010 | Dekker et al. |
| 2010/0158279 | A1 | 6/2010 | Conti et al. |
| 2010/0203664 | A1 | 8/2010 | Tsai et al. |
| 2012/0205754 | A1* | 8/2012 | Iwamoto ................ H03H 3/02 257/415 |
| 2014/0270272 | A1 | 9/2014 | Peng et al. |
| 2015/0041930 | A1 | 2/2015 | Kim et al. |
| 2015/0369653 | A1 | 12/2015 | Inoue |

\* cited by examiner

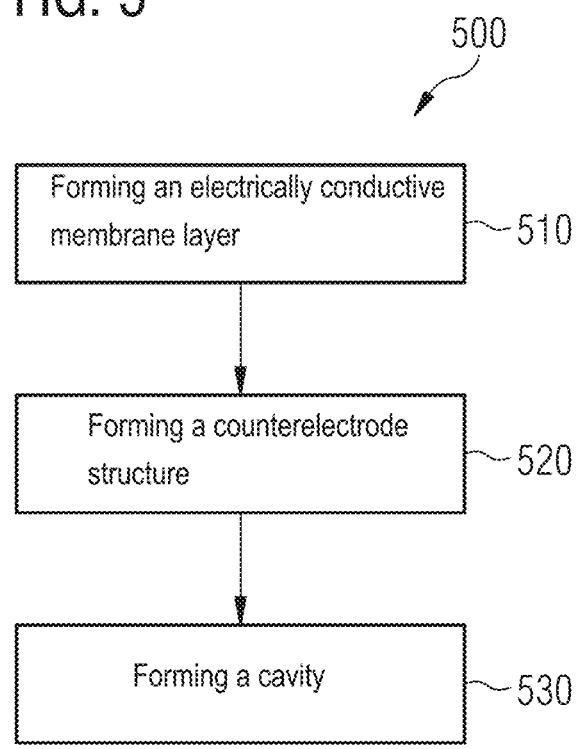

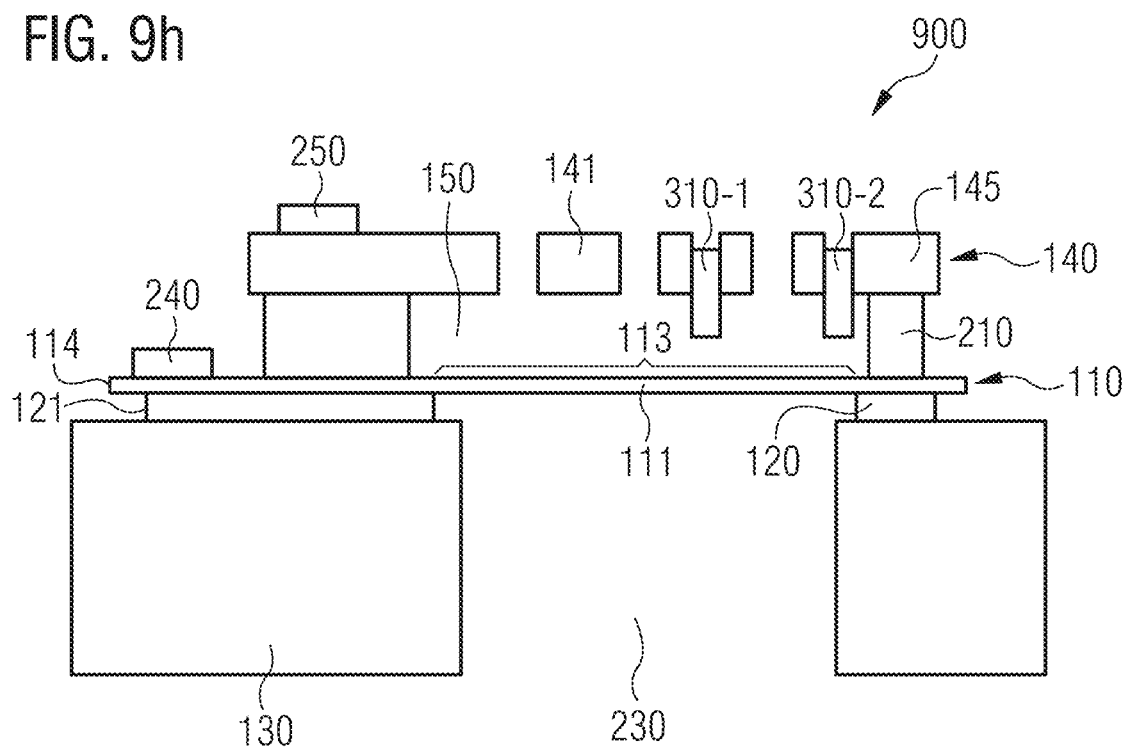
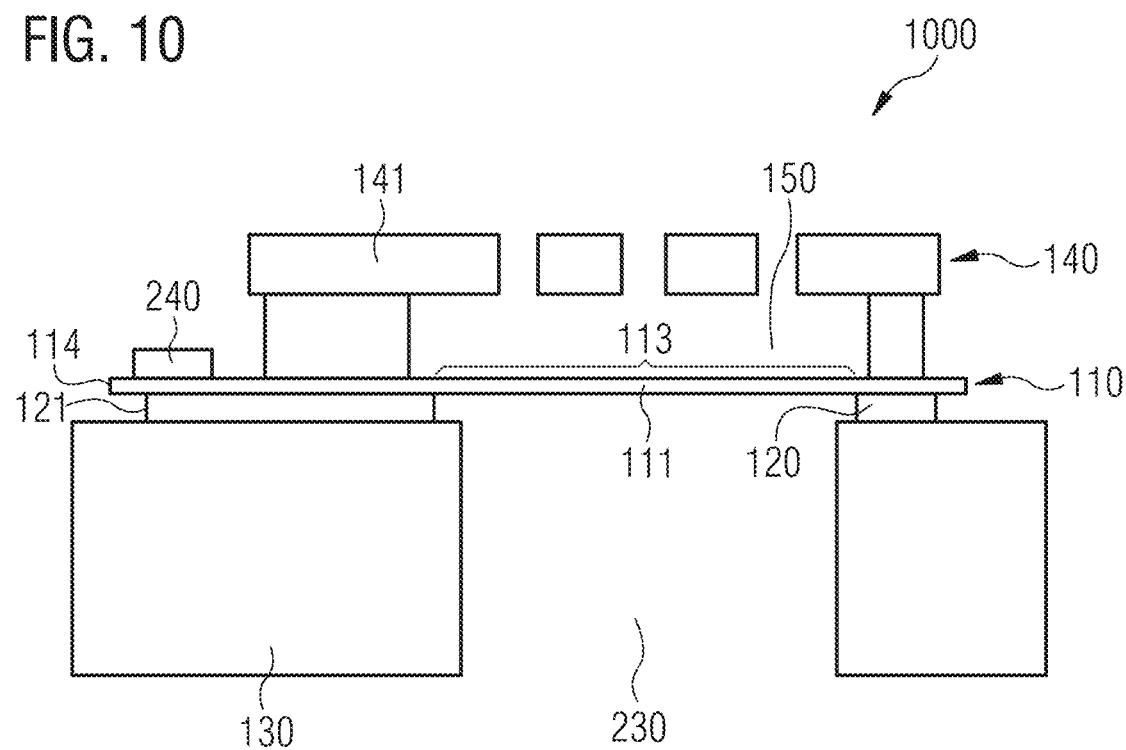

MEMBRANE COMPONENTS AND METHOD FOR FORMING A MEMBRANE COMPONENT

This application is a divisional of U.S. patent application Ser. No. 15/885,401, filed Jan. 31, 2018, which application claims the benefit of German Application No. 102017102190.6, filed on Feb. 3, 2017, which application is hereby incorporated herein by reference in its entirety.

TECHNICAL FIELD

Examples relate to production techniques for membrane components and in particular to membrane components and a method for forming a membrane component.

BACKGROUND

Production of a membrane component (for example a microphone, a pressure sensor or an acceleration sensor) often comprises a multiplicity of cost-intensive process steps. It may be desirable to provide cost-effective membrane components having a long lifetime.

SUMMARY

Some examples relate to a membrane component. The membrane component comprises a membrane structure comprising an electrically conductive membrane layer. The electrically conductive membrane layer has a suspension region and a membrane region. In addition, the suspension region of the electrically conductive membrane layer is arranged on an insulation layer. Furthermore, the insulation layer is arranged on a carrier substrate. Moreover, the membrane component comprises a counterelectrode structure. A cavity is arranged vertically between the counterelectrode structure and the membrane region of the electrically conductive membrane layer. In addition, an edge of the electrically conductive membrane layer projects laterally beyond an edge of the insulation layer by more than half of a vertical distance between the electrically conductive membrane layer and the counterelectrode structure. Furthermore, the electrically conductive membrane layer takes up more than 90% of forces which are exerted on the membrane structure in the event of a deflection of the membrane region of the electrically conductive membrane layer.

Some examples relate to a membrane component. The membrane component comprises a membrane structure comprising an electrically conductive membrane layer. The electrically conductive membrane layer has a suspension region and a membrane region. In addition, the suspension region of the electrically conductive membrane layer is arranged on an insulation layer. Furthermore, the insulation layer is arranged on a carrier substrate. Furthermore, the membrane component comprises a counterelectrode structure. The counterelectrode structure comprises a cutout. In addition, a cavity is arranged vertically between an electrically conductive counterelectrode layer of the counterelectrode structure and the membrane region of the electrically conductive membrane layer. Furthermore, the membrane component comprises an insulation structure of the counterelectrode structure. A first part of the insulation structure is arranged at least one part of a wall of the cutout of the counterelectrode structure. In addition, a second part of the insulation structure extends vertically into the cavity.

Some examples relate to a membrane component. The membrane component comprises a membrane structure having an electrically conductive membrane layer. The electrically conductive membrane layer comprises a first electrically conductive material. In addition, the electrically conductive membrane layer has a suspension region and a membrane region. Furthermore, the suspension region of the electrically conductive membrane layer is arranged on an insulation layer. Furthermore, the insulation layer is arranged on a carrier substrate. The membrane component additionally comprises a counterelectrode structure having an electrically conductive counterelectrode layer. The electrically conductive counterelectrode layer comprises a second electrically conductive material. In addition, a cavity is arranged vertically between the counterelectrode structure and the membrane region of the electrically conductive membrane layer. Furthermore, the first electrically conductive material differs from the second electrically conductive material.

Some examples relate to a method for forming a membrane component. The method comprises forming an electrically conductive membrane layer of a membrane structure on an insulation layer. The electrically conductive membrane layer has a suspension region and a membrane region. Furthermore, the insulation layer is arranged on a carrier substrate. Furthermore, the method comprises forming a counterelectrode structure laterally at least in the region of the electrically conductive membrane layer. The method additionally comprises forming a cavity arranged vertically between the counterelectrode structure and the membrane region of the electrically conductive membrane layer, such that the cavity extends vertically from an electrically conductive counterelectrode layer of the counterelectrode structure as far as the membrane region of the electrically conductive membrane layer. An edge of the electrically conductive membrane layer projects laterally beyond an edge of the insulation layer by more than half of a vertical distance between the electrically conductive membrane layer and the counterelectrode structure.

BRIEF DESCRIPTION OF THE DRAWINGS

Exemplary embodiments are explained in greater detail below with reference to the accompanying figures, in which:

FIG. 5 shows a flow diagram of a method for forming a further membrane component;

FIGS. 9a-9h show schematic process steps for forming a further membrane component; and FIG. 10 shows a schematic cross section of a further membrane component.

DETAILED DESCRIPTION OF ILLUSTRATIVE EMBODIMENTS

Figure 1:
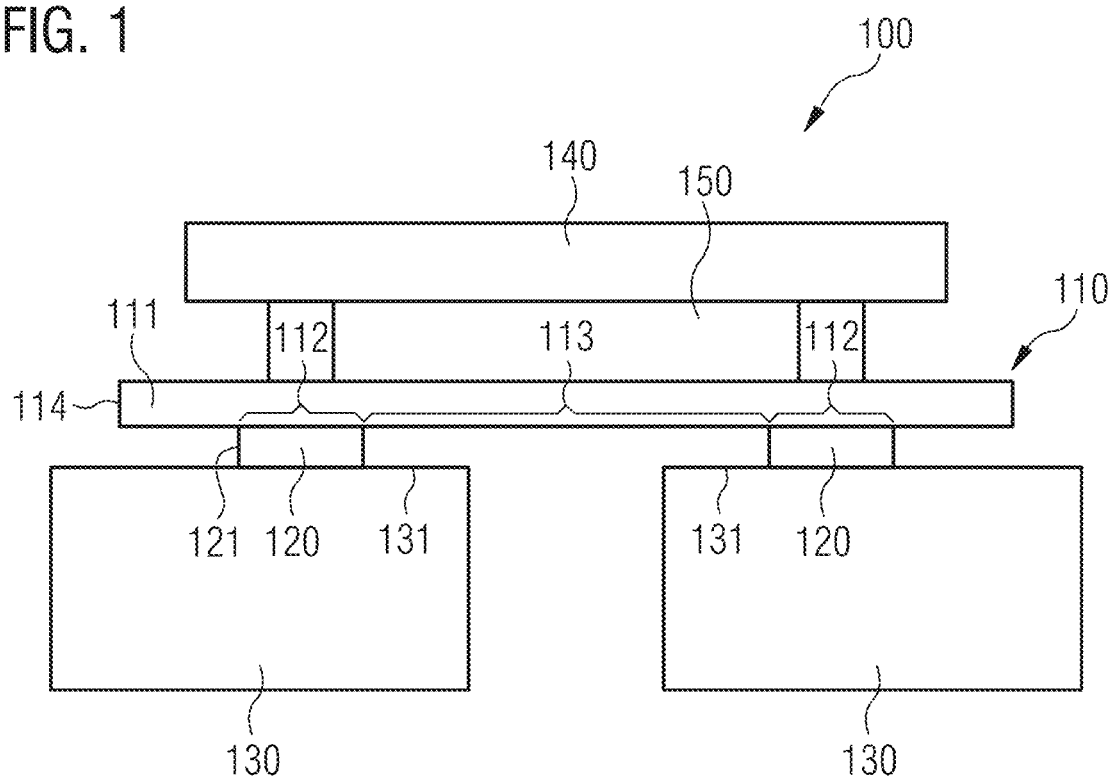
FIG. 1 shows a schematic cross section of a membrane component.

Various exemplary embodiments will now be described more thoroughly with reference to the accompanying drawings, in which some exemplary embodiments are illustrated. In the figures, the thickness dimensions of lines, layers and/or regions may be illustrated in an exaggerated manner for the sake of clarity.

In the following description of accompanying figures, which merely show some illustrative exemplary embodiments, identical reference signs may designate identical or comparable components. Furthermore, collective reference signs may be used for components and objects which occur multiply in an exemplary embodiment or in a drawing but are described jointly with regard to one or more features. Components or objects described with identical or collective reference signs, with regard to individual, a plurality or all of the features, for example their dimensions, may be embodied identically, but possibly also differently, unless the description explicitly or implicitly reveals something else.

Although exemplary embodiments may be modified and altered in various ways, exemplary embodiments are illustrated as examples in the figures and are described thoroughly herein. It should be clarified, however, that the intention is not for exemplary embodiments to be restricted to the forms respectively disclosed, rather that exemplary embodiments are intended to cover all functional and/or structural modifications, equivalents and alternatives which lie within the scope of the invention. Identical reference signs designate identical or similar elements throughout the description of the figures.

It should be noted that one element referred to as being "connected" or "coupled" to another element may be directly connected or coupled to the other element or intervening elements may be present. If two elements A and B are combined by an "or", then this should be understood to include all possible combinations, for example only "A", only "B" and "A and B". An alternative formulation for the same combination is at least one of "A" and "B". The same applies to the combinations of more than two elements.

The terminology used herein serves only to describe specific exemplary embodiments and is not intended to restrict the exemplary embodiments. As used herein, the singular forms "a" "an", "one" and "the" are also intended to include the plural forms, as long as the context does not clearly indicate something to the contrary. Furthermore, it should be clarified that the expressions such as e.g. "comprises", "comprising", "has" and/or "having", as used herein, indicate the presence of stated features, integers, steps, work sequences, elements and/or components, but do not preclude the presence or addition of one or a plurality of features, integers, steps, work sequences, elements, components and/or groups thereof.

As long as there is no definition to the contrary, all terms (including technical and scientific terms) used herein have the same meaning ascribed to them by a person of average skill in the art in the field with which the exemplary embodiments are associated. Furthermore, it should be clarified that expressions, e.g. those defined in dictionaries generally used, should be interpreted as if they had the meaning consistent with their meaning in the context of the relevant art, as long as a definition to the contrary is not expressly given herein.

FIG. 1 shows a schematic cross section of a membrane component 100. The membrane component 100 comprises a membrane structure 110 comprising an electrically conductive membrane layer 111. In addition, the electrically conductive membrane layer 111 has a suspension region 112 and a membrane region 113. Furthermore, the suspension region 112 of the electrically conductive membrane layer 111 is arranged on a (first) insulation layer 120. Furthermore, the (first) insulation layer 120 is arranged on a carrier substrate 130. The membrane component 100 additionally comprises a counterelectrode structure 140. In addition, a cavity 150 is arranged vertically between the counterelectrode structure 140 and the membrane region 113 of the electrically conductive membrane layer 111. Furthermore, a (lateral) edge 114 of the electrically conductive membrane layer 111 projects laterally beyond a (lateral) edge 121 of the (first) insulation layer 120 by more than half (or more than 75%, more than 90% or more than 100%) of a vertical distance between the electrically conductive membrane layer 111 and the counterelectrode structure 140. Furthermore, the electrically conductive membrane layer 111 takes up more than 90% (or more than 95% or more than 99%) of forces that are exerted on the membrane structure 110 in the event of a deflection of the membrane region 113 of the electrically conductive membrane layer 111.

By virtue of the fact that the electrically conductive membrane layer 111 takes up more than 90% of the forces that are exerted on the membrane structure 110 in the event of a deflection of the membrane region 113 of the electrically conductive membrane layer 111, further layers for reinforcing the membrane structure 110 can be omitted. As a result, the membrane component 100 can be provided cost-effectively. Furthermore, by virtue of the fact that the (lateral) edge 114 of the electrically conductive membrane layer 111 projects laterally beyond the (lateral) edge 121 of the (first) insulation layer 120 by more than half of the vertical distance between the electrically conductive membrane layer 111 and the counterelectrode structure 140, an electrical decoupling of the electrically conductive membrane layer 111 from the carrier substrate 130 can be optimized (by way of example, a parasitic capacitance can be reduced). As a result, a signal-to-noise ratio when determining a capacitance of a capacitor formed by the membrane structure 110 and the counterelectrode structure 140 (for example when detecting sound waves by means of the membrane component 100) can be improved. As a result, the membrane component 100 can have improved electrical properties. In addition, by virtue of the fact that the (lateral) edge 114 of the electrically conductive membrane layer 111 projects laterally beyond the (lateral) edge 121 of the (first) insulation layer 120 by more than half of the vertical distance between the electrically conductive membrane layer 111 and the counterelectrode structure 140, in the event of a deflection of the membrane region 113, it is possible to bring about a deflection (for example in an opposite direction) of a region of the electrically conductive membrane layer 111 that projects beyond the (lateral) edge 121. As a result, in the event of the deflection of the membrane region 113, a stress of the electrically conductive membrane layer 111, in particular in the suspension region 112, can be reduced. A lifetime of the electrically conductive membrane layer 111 and thus of the membrane component 100 can be increased as a result.

By way of example, the electrically conductive membrane layer 111 can have a projection region or overhang that projects laterally beyond the (lateral) edge 121 of the insulation layer 120. The projection region can have a lateral dimension (for example between the (lateral) edge 114 of the electrically conductive membrane layer 111 and the (lateral) edge 121 of the insulation layer 120) that is greater than half (or greater than 75%, greater than 90% or greater than 100%) of a vertical distance between the electrically conductive membrane layer 111 and the counterelectrode structure 140. By way of example, the electrically conductive membrane layer 111 can take up more than 90% (or more than 95% or more than 99%) of forces that occur in the membrane structure 110 in the event of a deflection of the membrane region 113 of the electrically conductive membrane layer 111. The electrically conductive membrane layer 111 can be for example a (for example p- or n-doped) polysilicon layer or a (for example p- or n-doped) amorphous polysilicon layer. By way of example, a lateral dimension (for example a width) of the electrically conductive membrane layer 111 can be more than 110% (or more than 125% or more than 150%) of a lateral dimension (for example a width) of the counterelectrode structure 140. The lateral dimension of the electrically conductive membrane layer 111 can be for example more than 1 μm (or more than 10 μm, more than 50 μm, more than 10100 μm or more than 250 μm) and less than 1000 μm (or less than 750 μm, less than 500 μm or less than 400 μm). A vertical dimension (for example a thickness) of the electrically conductive membrane layer 111 can be for example more than 25% (or more than 50% or more than 75%) of a vertical dimension (for example a thickness) of the (first) insulation layer 120 and/or more than 5% (or more than 10%, more than 20% or more than 30%) of a vertical dimension (for example a thickness) of the counterelectrode structure 140. By way of example, the vertical dimension of the electrically conductive membrane layer 111 can be more than 50 nm (or more than 100 nm, more than 200 nm, more than 300 nm, or more than 330 nm) and less than 1 m (or less than 750 nm, or less than 50 nm, less than 400 nm or less than 350 nm). The suspension region 112 of the electrically conductive membrane layer 111 can be for example a region of the electrically conductive membrane layer 111 which lies laterally completely in the region of the (first) insulation layer 120. By way of example, the membrane region 113 of the electrically conductive membrane layer 111 can be a region of the electrically conductive membrane layer 111 which lies laterally completely outside a region of the (first) insulation layer 120.

By way of example, the vertical distance between the electrically conductive membrane layer 111 and the counterelectrode structure 140 can be a vertical distance between the electrically conductive membrane layer 111 and the counterelectrode structure 140 in a non-loaded state of the membrane region 113 or in the case of a non-deflected membrane region 113. In the non-loaded state of the membrane region 113, by way of example, a pressure on a surface of the membrane region 113 that faces the cavity 150 can be equal in magnitude to a pressure on a surface of the membrane region 113 that faces away from the cavity 150. By way of example, the vertical distance between the electrically conductive membrane layer 111 and the counterelectrode structure 140 can be more than 50% (or more than 75%, more than 10%, more than 125% or more than 150%) of a vertical dimension of the counterelectrode structure 140.

By way of example, the counterelectrode structure 140 can comprise an electrically conductive counterelectrode layer. By way of example, the electrically conductive counterelectrode layer can be a (for example p- or n-doped) polysilicon layer, a (for example p- or n-doped) amorphous polysilicon layer, a metal layer (for example an aluminum layer, a copper layer or a gold layer) or an alloy layer (for example an aluminum-copper layer). A lateral dimension (for example a width) of the counterelectrode structure 140 can be for example more than 1 μm (or more than 10 μm, more than 50 μm, more than 100 μm or more than 250 μm) and less than 1000 μm (or less than 750 μm, less than 500 μm or less than 400 μm). By way of example, a vertical dimension of the counterelectrode structure 140 can be more than 500 nm (or more than 750 nm, more than 1 μm or more than 1.5 μm) and less than 10 μm (or less than 5 μm, less than 4 μm, less than 3 μm or less than 2 m).

By way of example, the (first) insulation layer 120 can be a silicon oxide (SiO2) layer or a silicon nitride (Si3N4) layer. The (first) insulation layer 120 can be for example a structured insulation layer. By way of example, the (first) insulation layer can be arranged on a surface 131 of the carrier substrate 130.

By way of example, the counterelectrode structure 140 can comprise a cutout with an insulation structure. Furthermore, at least one (first) part of the insulation structure can be arranged at least one part of a wall of the cutout of the counterelectrode structure 140. By way of example, the insulation structure can comprise silicon oxide or silicon nitride. By way of example, a lateral cross section of the insulation structure can have an elliptic shape, a circular shape or a rectangular shape. The insulation structure can have for example a sleeve shape or a shape of a closed tube. By way of example, a lateral cross section of the cutout can have a circular shape, an elliptic shape or a slot shape. By way of example, the cutout can be an opening in the counterelectrode structure 140. A lateral dimension of the cutout can be for example more than 200 nm (or more than 500 nm, more than 1 μm or more than 5 μm). By way of example, a lateral dimension of the insulation structure can be more than 100 nm (or more than 200 nm, more than 500 nm or more than 1 μm).

By way of example, a material of the insulation structure and a material of the (first) insulation layer 120 can be different. By way of example, the insulation structure can comprise silicon nitride and the (first) insulation layer 120 can comprise silicon oxide, or vice versa.

By way of example, a lateral dimension (for example a width) of the insulation structure can correspond to a lateral dimension (for example a width) of the cutout of the counterelectrode structure 140. As a result, the first part of the counterelectrode structure 140 and the second part of the counterelectrode structure 140 can be efficiently mechanically connected to one another and at the same time electrically insulated from one another.

By way of example, a second part of the insulation structure can extend from an electrically conductive counterelectrode layer of the counterelectrode structure 140 vertically into the cavity 150. As a result, a deflection of the membrane region 113 of the electrically conductive membrane layer 111 in the direction of the counterelectrode structure 140 can be limited by means of the insulation structure. It is thereby possible to prevent the membrane region 113 from sticking to the counterelectrode structure 140 in the event of a great deflection of the membrane region 113. A lifetime of the membrane component 100 can be increased as a result. By way of example, the insulation structure can form a spacer or shock absorber for the membrane region 113. A vertical dimension of the second part of the insulation structure can be for example more than 10% (or more than 20%, more than 30% or more than 40%) and less than 9% (or less than 80%, less than 70% or less than 60%) of the vertical distance between the electrically conductive membrane layer 111 and the counterelectrode structure 140.

By way of example, a second insulation layer can be arranged vertically between the counterelectrode structure 140 and the membrane region 113. The second insulation layer can laterally surround the cavity 150.

By way of example, a material of the insulation structure and a material of the second insulation layer can be different. The second insulation layer and the (first) insulation layer 120 can comprise the same material, for example. The second insulation layer can be a structured insulation layer, for example.

By way of example, the cutout can divide the electrically conductive counterelectrode layer 141 into a first part and a second part. The first part and the second part can be electrically insulated from one another. As a result, one of the parts (for example the second part) of the electrically conductive counterelectrode layer 141 can be put at an undefined potential (referred to as "floating potential"). By way of example, the cutout can surround the second part of the electrically conductive counterelectrode layer 141 from three sides or in an Ω-shaped fashion. The second part of the electrically conductive counterelectrode layer 141 can be for example an edge region of the electrically conductive counterelectrode layer 141.

By way of example, the first part of the electrically conductive counterelectrode layer 141 can be connected to a contact structure. The second part of the electrically conductive counterelectrode layer 141 can be potential-free (for example electrically floating). As a result, a parasitic capacitance of the membrane component can be reduced. It is thereby possible to improve a signal-to-noise ratio when determining a capacitance of a capacitor formed by the membrane structure 110 and the counterelectrode structure 140 (for example when detecting sound waves by means of the membrane component). A membrane component having improved electrical properties can be formed as a result.

By way of example, the carrier substrate 130 can have a cutout. The (first) insulation layer 120 can laterally surround the cutout. As a result, the membrane region 113 of the electrically conductive membrane layer 111 can be connected to an environment of the membrane component 100. As a result, a change in pressure in the environment of the membrane component 100 (for example a change in pressure caused by sound waves) can bring about a deflection of the membrane region 113.

By way of example, the cutout can lie laterally in the region of the cavity 150. The cutout can penetrate through the carrier substrate 130, for example. Alternatively, a depth of the cutout can be less than a thickness of the carrier substrate 130.

By way of example, a lateral dimension of the membrane region 113 of the electrically conductive membrane layer 111 can be more than 110% (or more than 125% or more than 150%) of a lateral dimension of the cutout at the surface 131 of the carrier substrate 130. A deflection of the membrane region 113 in the event of a change in pressure in the environment of the membrane component 100 can be reduced as a result. Higher pressures or higher pressure differences can be detected by means of the membrane component 100 as a result.

By way of example, an anti-stick layer can be arranged at a surface of the membrane region 113 of the electrically conductive membrane layer 111. It is thereby possible to prevent the electrically conductive membrane layer 111 from sticking to the counterelectrode structure 140 in the event of a deflection of the membrane region 113. A lifetime of the membrane component 100 can be increased as a result.

By way of example, a hydrophobic layer can be arranged at a surface of the membrane region 113 of the electrically conductive membrane layer 111. It is thereby possible to prevent water from settling on the surface of the membrane region 113. As a result, corrosion of the membrane region can be reduced and a lifetime of the membrane component 100 can thus be increased.

By way of example, the anti-stick layer or the hydrophobic layer can be a perfluorodecyltrichlorosilane (FDTS) layer. As a result, the anti-stick layer or the hydrophobic layer can be arranged at the surface of the membrane region 113 in a cost-effective manner. The membrane component 100 can be provided cost-effectively as a result. The perfluorodecyltrichlorosilane layer can be for example a single-ply layer (for example a monolayer).

By way of example, the carrier substrate 130 can be a glass substrate (for example a glass wafer or a glass sheet) or a semiconductor substrate (for example a semiconductor wafer or a semiconductor slice). By way of example, the carrier substrate 130 can be a silicon (Si)-based semiconductor substrate, a silicon carbide (SiC)-based semiconductor substrate, a gallium arsenide (GaAs)-based semiconductor substrate, a gallium nitride (GaN)-based semiconductor substrate, or a silicon-on-insulator (SOI) semiconductor substrate.

By way of example, a vertical direction, a vertical dimension or a depth can be measured perpendicularly to the surface 131 of the carrier substrate 130 and a lateral direction or a lateral dimension can be measured parallel to the surface 131 of the carrier substrate 130. By way of example, the surface 131 of the carrier substrate 130 can be a front side of the carrier substrate 130. A front side of the carrier substrate 130 can be for example a surface of the carrier substrate 130 on which the intention is to produce more complex structures than on a rear side of the carrier substrate 130, since process parameters (for example a temperature) and a treatment of the rear side may be restricted if structures have already been formed on the front side.

By way of example, an electrically conductive layer can have an (electrical) resistivity of less than $1*10^{15}$ Ωm (or less than $1*10^{10}$ Ωm, less than $1*10^{5}$ Ωm, or less than 1 Ωm).

By way of example, the membrane region 113 of the electrically conductive membrane layer 111 and the counterelectrode structure 140 can form a capacitor. A capacitance of the capacitor can be changed as a result of deflection of the membrane region 113 relative to the counterelectrode structure 140. The membrane component 100 can comprise for example a circuit for detecting the change in the capacitance of the capacitor and for generating an electrical signal representing the detected change in the capacitance of the capacitor. In the case where the carrier substrate 130 is a semiconductor substrate, the circuit can be formed on the semiconductor substrate.

By way of example, the membrane component 100 can be an element of a Micro-Electro-Mechanical System (MEMS) component (for example of a MEMS microphone), of a microphone, of a pressure sensor or of an acceleration sensor or form a MEMS component (for example a MEMS microphone), a microphone, a pressure sensor or an acceleration sensor.

By way of example, a capacitive MEMS microphone can comprise a deflectable membrane (for example the membrane region 113) and a static reference electrode (for example the counterelectrode structure 140), which are connected to a sound terminal of a housing, and also an Application-Specific Integrated Circuit (ASIC) for biasing and read-out.

Figure 2:
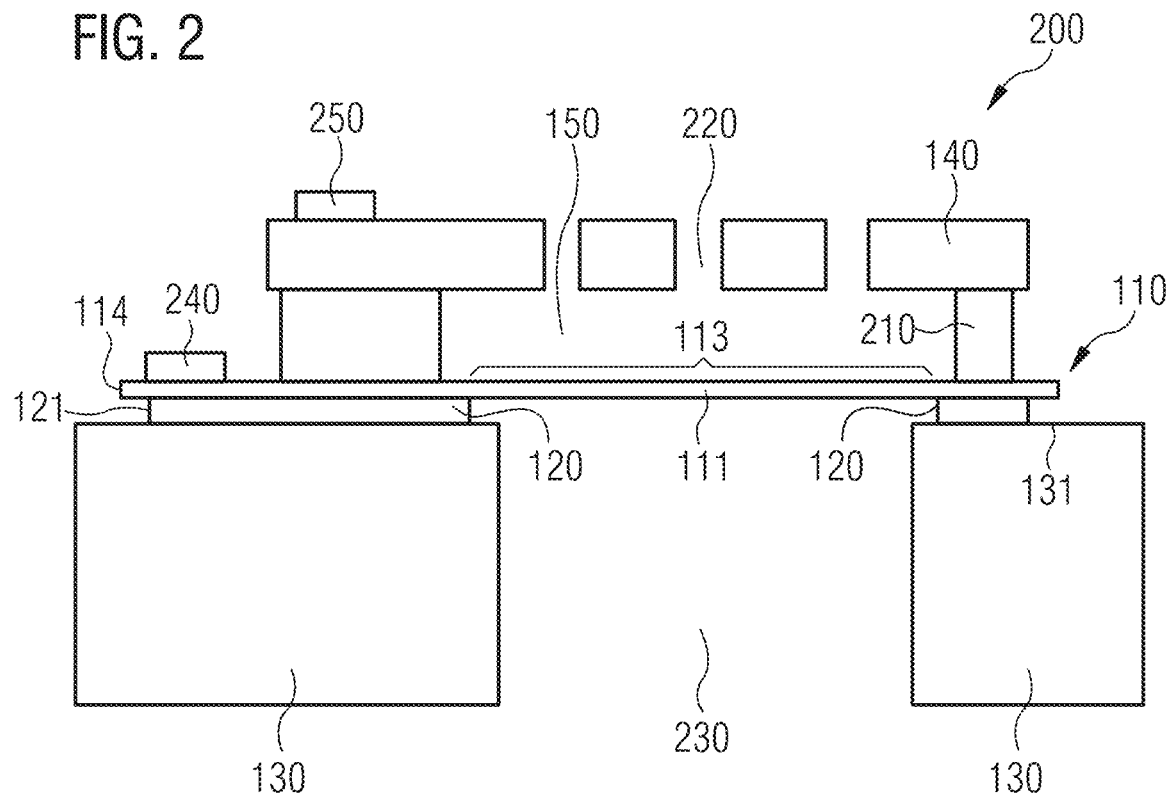
FIG. 2 shows a schematic cross section of a further membrane component.

FIG. 2 shows a schematic cross section of a further membrane component 200. The membrane component 200 can be configured like the membrane component 100 described in association with FIG. 1. The membrane component 200 comprises a membrane structure 110 (for example a membrane) arranged on a first insulation layer 120. The membrane structure 110 comprises an electrically conductive membrane layer 111. Furthermore, an edge 114 of the electrically conductive membrane layer 111 projects laterally beyond an edge 121 of the first insulation layer 120. In addition, the membrane component 200 comprises a second insulation layer 210 arranged on the membrane structure 110. A counterelectrode structure 140 (for example a backplate) is arranged on the second insulation layer 210. The counterelectrode structure 140 has a plurality of cutouts 220. In addition, a cavity 150 is arranged vertically between the counterelectrode structure 140 and the electrically conductive membrane layer 111. By way of example, pressure equalization between the cavity 150 and an environment of the membrane component 200 can be effected via the cutouts 220. The second insulation layer 210 laterally delimits the cavity 150. Furthermore, the carrier substrate 130 has a cutout 230. A lateral dimension of the cutout 230 is smaller than a lateral dimension of the cavity 150 and then a lateral dimension of a membrane region 113 of the electrically conductive membrane layer 111. In addition, a first contact structure 240 is arranged on the electrically conductive membrane layer 111 and a second contact structure 250 is arranged on the counterelectrode structure 140. By way of example, the contact structures 240, 250 can serve as connection pads (for example for bond structures) for the electrically conductive membrane layer 111 and the counterelectrode structure 140. The contact structures 240, 250 can for example each comprise a structured metal layer (for example a structured aluminum layer) or a structured alloy layer (for example a structured aluminum-copper alloy layer).

FIG. 2 shows one example of a membrane component 200 having four layers. By way of example, the membrane component 200 can be formed or produced within two weeks. The four layers can comprise for example a membrane (for example the membrane structure 110), a backplate (for example the counterelectrode structure 140), one or a plurality of connection pads (for example the contact structures 240, 250) and a cavity 150. By way of example, in the case of the membrane component 200, all unnecessary elements can be eliminated and low costs (for example when forming the membrane component 200) can be achieved by intelligent technical engineering.

By way of example, in the case of the membrane component 200, the number of layers in accordance with basic functions of a transducer can be reduced to an absolute minimum: a deflectable membrane (for example a membrane region 113), a perforated static reference electrode or backplate (for example a counterelectrode structure 140), an access hole (for example a cutout 230) to the membrane in the carrier substrate 130 (cavity) and a metal connection to the external circuit arrangement (for example the contact structures 240, 250).

Further details and aspects will be mentioned in association with the embodiments described above or below. The embodiment shown in FIG. 2 can comprise one or more optional additional features corresponding to one or more aspects mentioned in connection with the proposed concept or one or more of the embodiments described above (for example FIG. 1) or below (for example FIGS. 3-10).

Figure 3:
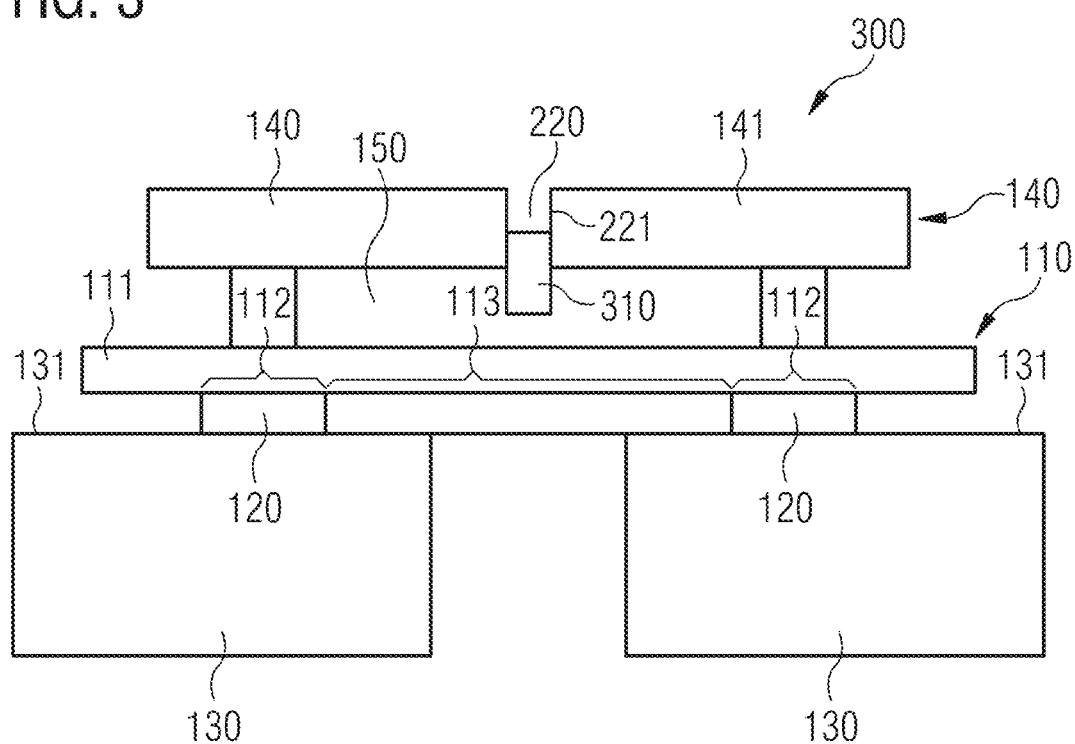
FIG. 3 shows a schematic cross section of a further membrane component.

FIG. 3 shows a schematic cross section of a further membrane component 300. The membrane component comprises a membrane structure 110 having an electrically conductive membrane layer 111. The electrically conductive membrane layer 111 has a suspension region 112 and a membrane region 113. In addition, the suspension region 112 of the electrically conductive membrane layer 111 is arranged on a (first) insulation layer 120. Furthermore, the (first) insulation layer 120 is arranged on a carrier substrate 130. Furthermore, the membrane component 300 comprises a counterelectrode structure 140. The counterelectrode structure 140 comprises a cutout 220. In addition, a cavity 150 is arranged vertically between an electrically conductive counterelectrode layer 141 of the counterelectrode structure 140 and the membrane region 113 of the electrically conductive membrane layer 111. Furthermore, the membrane component 300 comprises an insulation structure 310 of the counterelectrode structure 140. A first part of the insulation structure 310 is arranged at least one part of a wall 221 of the cutout 220 of the counterelectrode structure 140. In addition, a second part of the insulation structure 310 extends vertically into the cavity 150.

By arranging the insulation structure 310 at least the part of the wall 221 of the cutout 220, it is possible for the insulation structure 310 to be mechanically secured to the counterelectrode structure 140 in a cost-effective manner. The membrane component 300 can be provided cost-effectively as a result. In addition, by virtue of the fact that the second part of the insulation structure 310 extends vertically into the cavity 150, it is possible to limit a deflection of the membrane region 113 of the electrically conductive membrane layer 111 in the direction of the counterelectrode structure 140. It is thereby possible to avoid a contact between the membrane region 113 and the counterelectrode structure 140 in the event of a great deflection of the membrane region 113. It is thereby possible to prevent the membrane region 113 from sticking to the counterelectrode structure 140 in the event of a great deflection of the membrane region 113. A lifetime of the membrane component 300 can be increased as a result.

The membrane component 300 and its elements can be configured in a similar manner to the membrane component 100 and the elements thereof as described in association with FIG. 1. By way of example, the (first) insulation layer can be arranged on a surface 131 of the carrier substrate 130.

Further details and aspects will be mentioned in association with the embodiments described above or below. The embodiment shown in FIG. 3 can comprise one or more optional additional features corresponding to one or more aspects mentioned in connection with the proposed concept of one or more of the embodiments described above (for example FIG. 12) or below (for example FIGS. 4-10).

Figure 4:
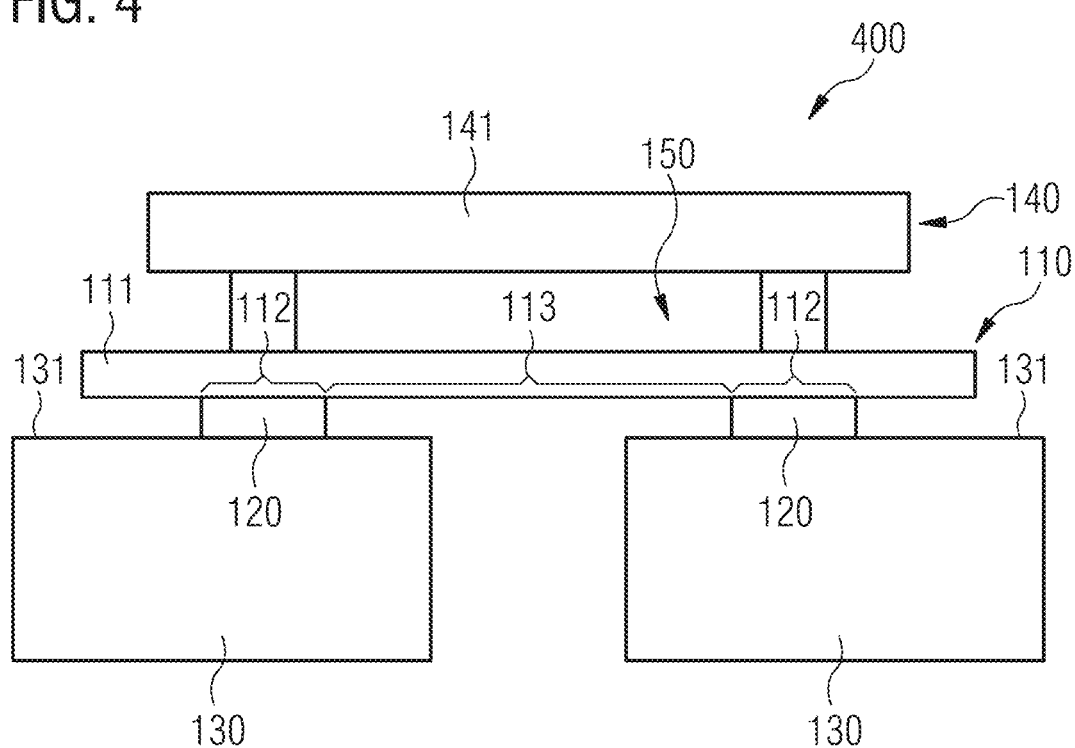
FIG. 4 shows a schematic cross section of a further membrane component.

FIG. 4 shows a schematic cross section of a further membrane component 400. The membrane component 400 comprises a membrane structure 110 comprising an electrically conductive membrane layer 111. The electrically conductive membrane layer 111 comprises a first electrically conductive material. In addition, the electrically conductive membrane layer 111 has a suspension region 112 and a membrane region 113. Furthermore, the suspension region 112 of the electrically conductive membrane layer 111 is arranged on a (first) insulation layer 120. Furthermore, the (first) insulation layer 120 is arranged on a carrier substrate 130. The membrane component 400 additionally comprises a counterelectrode structure 140 having an electrically conductive counterelectrode layer 141. In addition, the electrically conductive counterelectrode layer 141 comprises a second electrically conductive material. Furthermore, a cavity 150 is arranged vertically between the counterelectrode structure 140 and the membrane region 113 of the electrically conductive membrane layer 111. Furthermore, the first electrically conductive material differs from the second electrically conductive material.

By virtue of the fact that the electrically conductive membrane layer 111 and the electrically conductive counterelectrode layer 141 comprise different electrically conductive materials, the electrically conductive counterelectrode layer 141 can be formed from a more cost-effective electrically conductive material than the electrically conductive membrane layer 111. The membrane component 400 can be provided cost-effectively as a result.

By way of example, the first electrically conductive material can be a flexible electrically conductive material. The second electrically conductive material can be a rigid electrically conductive material, for example. By way of example, the (first) insulation layer can be arranged on a surface 131 of the carrier substrate 130.

By way of example, the first electrically conductive material can be polysilicon. The second electrically conductive material can be at least one from a metal and an alloy. A cost-intensive additional metallization of the counterelectrode structure 140 for forming a connection pad (for example for a bond structure) can be omitted as a result. The membrane component 400 can be provided cost-effectively as a result. By way of example, the second electrically conductive material can be aluminum, copper or an aluminum-copper alloy.

The membrane component 400 and its elements can be configured in a manner similar to the membrane component 100 and the elements thereof as described in association with FIG. 1.

Further details and aspects will be mentioned in association with the embodiments described above or below. The embodiment shown in FIG. 4 can comprise one or more optional additional features corresponding to one or more aspects mentioned in connection with the proposed concept of one or more of the embodiments described above (for example FIGS. 1-3) or below (for example FIGS. 5-10).

FIG. 5 shows a flow diagram of a method 500 for forming a further membrane component. The method 500 comprises forming 510 an electrically conductive membrane layer 111 of a membrane structure 110 on a (first) insulation layer 120. The electrically conductive membrane layer 111 has a suspension region 112 and a membrane region 113. Furthermore, the (first) insulation layer 120 is arranged on a carrier substrate 130. Furthermore, the method 500 comprises forming 520 a counterelectrode structure 140 laterally at least in the region of the electrically conductive membrane layer 111. The method 500 additionally comprises forming 530 a cavity 150 arranged vertically between the counterelectrode structure 140 and the membrane region 113 of the electrically conductive membrane layer 111, such that the cavity 150 extends vertically from an electrically conductive counterelectrode layer 141 of the counterelectrode structure 140 as far as the membrane region 113 of the electrically conductive membrane layer 111. A (lateral) edge 114 of the electrically conductive membrane layer 111 projects laterally beyond a (lateral) edge 121 of the (first) insulation layer 120 by more than half (or more than 75%, more than 9% or more than 100%) of a vertical distance between the electrically conductive membrane layer 111 and the counterelectrode structure 140.

By virtue of the fact that the (lateral) edge 114 of the electrically conductive membrane layer 111 projects laterally beyond the (lateral) edge 121 of the (first) insulation layer 120 by more than half of the vertical distance between the electrically conductive membrane layer 111 and the counterelectrode structure 140, an electrical decoupling of the electrically conductive membrane layer 111 from the carrier substrate 130 can be optimized (by way of example, a parasitic capacitance can be reduced). As a result, a signal-to-noise ratio when determining a capacitance of a capacitor formed by the membrane structure 110 and the counterelectrode structure 140 (for example when detecting sound waves by means of the membrane component) can be improved. As a result, a membrane component having improved electrical properties can be formed. In addition, by virtue of the fact that the (lateral) edge 114 of the electrically conductive membrane layer 111 projects laterally beyond the (lateral) edge 121 of the (first) insulation layer 120 by more than half of the vertical distance between the electrically conductive membrane layer 111 and the counterelectrode structure 140, in the event of a deflection of the membrane region 113, it is possible to bring about a deflection (for example in an opposite direction) of a region of the electrically conductive membrane layer 111 that projects beyond the (lateral) edge 121. As a result, in the event of the deflection of the membrane region 113, a stress of the electrically conductive membrane layer 111, in particular in the suspension region 112, can be reduced. A membrane component having a long lifetime can be formed as a result.

By way of example, the membrane component 100 described in association with FIG. 1, the membrane component 200 described in association with FIG. 2, the membrane component 300 described in association with FIG. 3 and/or the membrane component 400 described in association with FIG. 4 can be formed by means of the method 500.

By way of example, forming 510 the electrically conductive membrane layer 111 can comprise depositing an electrically conductive layer on the (first) insulation layer 120 and structuring the deposited electrically conductive layer.

By way of example, the method 500 can furthermore comprise forming a second insulation layer 210 on the membrane structure 110. Forming 520 the counterelectrode structure 140 can be effected on the second insulation layer 210. The method 500 can additionally comprise forming a cutout 220 in the counterelectrode structure 140. The cutout 220 can penetrate vertically through the counterelectrode structure 140. As a result, in a subsequent process step, an insulation structure 310 (for example for electrically separating parts of the counterelectrode structure 140) can be formed in the cutout. By way of example, forming the cutout 220 in the counterelectrode structure 140 can be carried out before forming 530 the cavity 150.

Alternatively, forming 530 the cavity 150 can comprise removing a sacrificial layer (for example a carbon layer) laterally in the region of the membrane region 113.

By way of example, the cutout 220 can extend into the second insulation layer 210. The cutout 220 can end at a vertical distance from the counterelectrode structure 140 of more than 25% (or more than 50%, more than 75%, or more than 9%) of a thickness of the second insulation layer 210.

By way of example, the cutout 220 can end at a vertical distance from the counterelectrode structure 140 of less than 75% (or less than 60% or less than 50%) of the thickness of the second insulation layer 210. By virtue of the fact that the vertical dimension of the cutout of the second insulation layer 210 is less than 75% of the vertical distance between the electrically conductive membrane layer 111 and the counterelectrode structure 140, structures which project into the cavity 150 and are spaced apart from the electrically conductive membrane layer 111 can be formed in the cutout of the second insulation layer 210 in a subsequent process step.

By way of example, the cutout 220 can divide the electrically conductive counterelectrode layer 141 into at least two parts electrically insulated from one another. As a result, one of the parts of the electrically conductive counterelectrode layer 141 can be put at an undefined potential (referred to as "floating potential"). A parasitic capacitance of the membrane component can be reduced as a result. It is thereby possible to improve the signal-to-noise ratio when determining a capacitance of a capacitor formed by the membrane structure 110 and the counterelectrode structure 140 (for example when detecting sound waves by means of the membrane component). A membrane component having improved electrical properties can be formed as a result.

By way of example, forming the cutout 220 in the counterelectrode structure 140 can comprise masking the counterelectrode structure 140 and etching the masked counterelectrode structure 140. Forming the cutout 220 in the second insulation layer 210 can be carried out for example in one process step with the etching of the masked counterelectrode structure 140.

By way of example, the method 500 can furthermore comprise forming a third insulation layer at a wall 221 of the cutout 220 of the counterelectrode structure 140. The third insulation layer can be formed for example by depositing an insulation material on the surface of the counterelectrode structure 140. During the deposition of the insulation material, the insulation material can penetrate into the cutout 220 of the counterelectrode structure 140.

By way of example, the third insulation layer can fill the cutout 220 of the counterelectrode structure 140. A mechanical connection of mutually opposite walls of the cutout 220 (for example in the case of segmentation) can be achieved as a result.

By way of example, a material of the second insulation layer 210 and a material of the third insulation layer can be different. As a result, the second insulation layer 210 and the third insulation layer can be processed differently in a subsequent process step. By way of example, in the subsequent process step, the second insulation layer 210 can be at least partly removed, while the third insulation layer is maintained, or vice versa. By way of example, the second insulation layer 210 can be a silicon oxide layer and the third insulation layer can be a silicon nitride layer, or vice versa.

By way of example, the method 500 can furthermore comprise partly removing the third insulation layer, such that a remaining part of the third insulation layer forms an insulation structure 310. At least a first part of the insulation structure 310 can be arranged at least one part of the wall 221 of the cutout 220 of the counterelectrode structure 140. As a result, it is possible to form a spacer or shock absorber—formed by the insulation structure 310—for restricting a maximum vertical deflection of the membrane region 113 of the electrically conductive membrane layer 111. It is thereby possible to prevent the membrane region 113 from sticking to the counterelectrode structure 140. A membrane component having a long lifetime can be formed as a result.

By way of example, forming 530 the cavity 150 can comprise removing the second insulation layer 210 laterally in the region of the membrane region 113 of the electrically conductive membrane layer 111. A lateral overhang of the electrically conductive membrane layer 111 over the first insulation layer 120 can be formed during the process of forming 530 a cavity 150. By way of example, the lateral overhang can be formed in such a way that the (lateral) edge 114 of the electrically conductive membrane layer 111 projects laterally beyond the (lateral) edge 121 of the (first) insulation layer 120 by more than half (or more than 75%, more than 9% or more than 100%) of the vertical distance between the electrically conductive membrane layer 111 and the counterelectrode structure 140.

By way of example, the method 500 can comprise jointly forming a first contact structure 240 at the suspension region 112 of the electrically conductive membrane layer 111 and a second contact structure 250 at the electrically conductive counterelectrode layer 141. It is thereby possible to form connection pads for the electrical contacting (for example by means of bond structures) of the electrically conductive membrane layer 111 of the membrane structure 110 and of the electrically conductive counterelectrode layer 141 of the counterelectrode structure 140. By way of example, jointly forming the first contact structure 240 and the second contact structure 250 can comprise depositing an electrically conductive layer (for example a metal layer) and structuring the deposited electrically conductive layer, such that the first contact structure 240 and the second contact structure 250 remain. The first contact structure 240 can be formed for example simultaneously or in one process step with the second contact structure 250.

By way of example, removing an insulation layer can comprise an isotropic or anisotropic etching process. The etching process can be a dry etching process (for example deep reactive ion etching) or a wet-chemical etching process.

Further details and aspects will be mentioned in association with the embodiments described above or below. The embodiment shown in FIG. 5 can comprise one or more optional additional features corresponding to one or more aspects mentioned in connection with the proposed concept of one or more of the embodiments described above (for example FIGS. 1-4) or below (for example FIGS. 6a-10).

FIGS. 6a to 6h show schematic process steps for forming a further membrane component 600. Forming the membrane component 600 can be carried out in a manner similar to the method 500 described in association with FIG. 5. In addition, the membrane component 600 can be configured like the membrane component 200 described in association with FIG. 2.

Figure 6A:
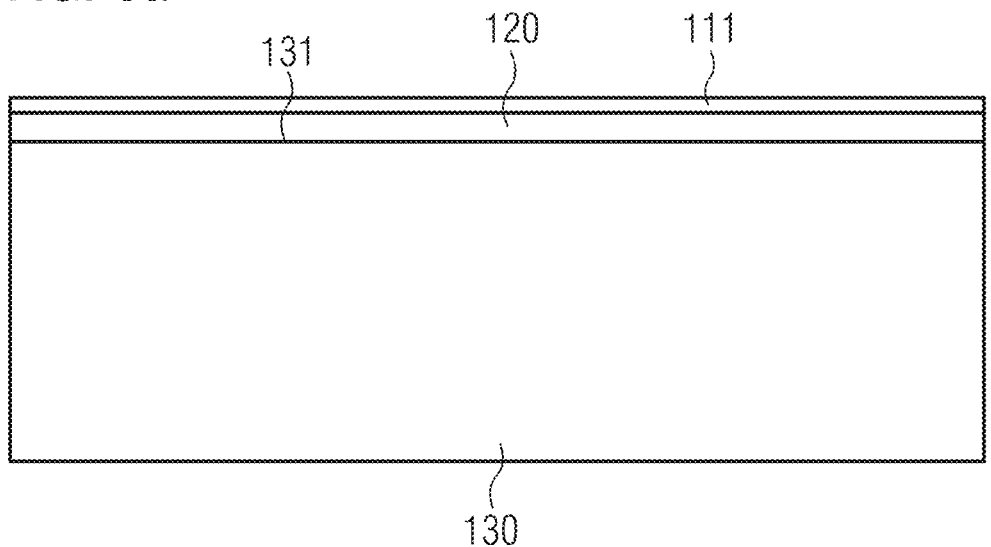
FIGS. 6a-6h show schematic process steps for forming a further membrane component.

FIG. 6a shows a first process step for forming the membrane component 600. On a surface 131 of a carrier substrate 130, a first insulation layer 120 was deposited, as was an electrically conductive membrane layer 111. By way of example, the carrier substrate 130 can be a silicon substrate, the first insulation layer 120 can be deposited by means of chemical vapor deposition from tetraethyl orthosilicate (TEOS) (for example with a stop at 600 nm) and the electrically conductive membrane layer 111 can be an amorphous polysilicon layer. The first insulation layer 120 can have a thickness of 600 nm, for example. By way of example, the electrically conductive membrane layer 111 can have a thickness of 330 nm. After the deposition of the electrically conductive membrane layer 111, it is possible to carry out for example a p-type implantation (for example, an implantation of boron atoms or phosphorous atoms) of the electrically conductive membrane layer 111 (for example of a membrane) and subsequent annealing. By way of example, the electrically conductive membrane layer 111 can be an element of a membrane structure 110.

Figure 6B:
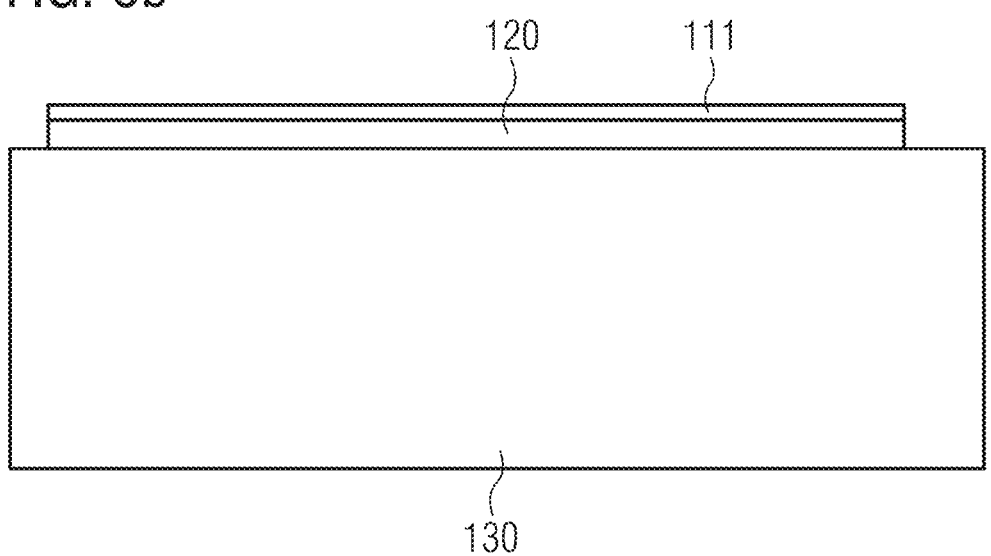

FIG. 6b shows a second process step for forming the membrane component 600. The first insulation layer 120 and the electrically conductive membrane layer 111 were structured. By way of example, the structuring of the first insulation layer 120 and of the electrically conductive membrane layer 111 can comprise etching the first insulation layer 120 and the electrically conductive membrane layer 111 (for example poly-TEOS etching).

By way of example, the structuring of the electrically conductive membrane layer (for example of a poly layer) and of the underlying first insulation layer (for example of an oxide) can be carried out with an identical mask layer or using a poly mask for oxide dry etching. In a work set-up, it is possible for example to use a resist technology for a topology and/or subsequent process steps.

Figure 6C:
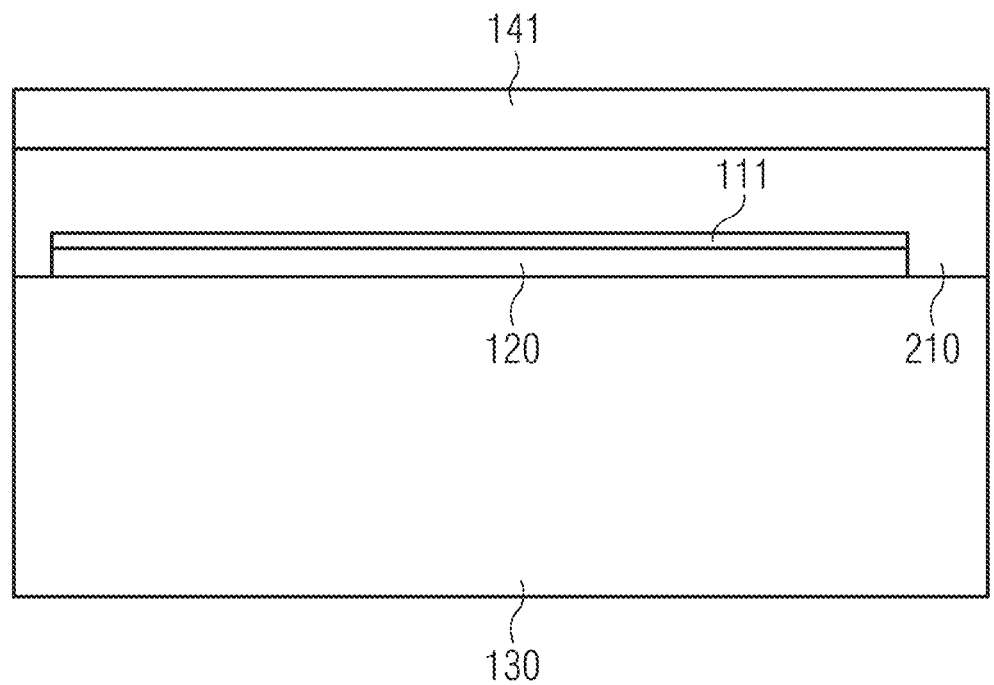

FIG. 6c shows a third process step for forming the membrane component 600. On the carrier substrate 130, a second insulation layer 210 was deposited, as was an electrically conductive counterelectrode layer 141. By way of example, the second insulation layer 210 can be deposited by means of chemical vapor deposition from tetraethyl orthosilicate (TEOS) (for example with a spacing of 3×6 nm) and the electrically conductive counterelectrode layer 141 can be an amorphous polysilicon layer. Alternatively, the electrically conductive counterelectrode layer 141 can comprise a thin silicon nitride (Si3N4) layer and a polysilicon layer. In this case, charge effects can occur during operation of the membrane component. The second insulation layer 210 can have a thickness of 1.8 µm, for example. By way of example, the electrically conductive counterelectrode layer 141 can have a thickness of 1.5 µm. After the deposition of the electrically conductive counterelectrode layer 141, it is possible for example to carry out a p-type implantation (for example, an implantation of boron atoms or phosphorous atoms) of the electrically conductive counterelectrode layer 141 (for example of a backplate) and subsequent annealing. By way of example, the electrically conductive counterelectrode layer 141 can be an element of a counterelectrode structure 140.

Figure 6D:
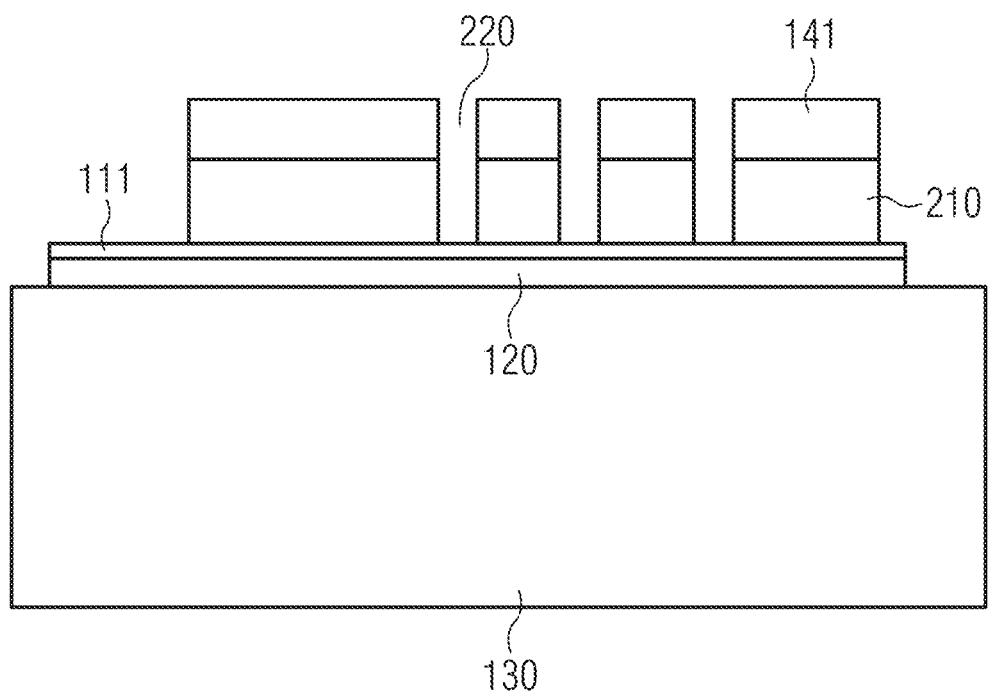

FIG. 6d shows a fourth process step for forming the membrane component 600. The second insulation layer 210 and the electrically conductive counterelectrode layer 141 were structured. In this case, three cutouts 220 were formed in the electrically conductive counterelectrode layer 141 and the second insulation layer 210. The cutouts 220 extend as far as the electrically conductive membrane layer 111. By way of example, the structuring of the second insulation layer 210 and of the electrically conductive counterelectrode layer 141 can comprise etching the second insulation layer 210 and the electrically conductive counterelectrode layer 141 (for example poly-TEOS etching).

By way of example, it is possible to form a topology of approximately 1 µm in the electrically conductive counterelectrode layer 141 or a poly layer over an edge of the electrically conductive membrane layer 111 or a membrane edge. In a work set-up, it is possible to carry out for example a poly spacer removal before an oxide etch (for example before etching the second oxide layer 210). In this case, it is possible to carry out for example an undercut etching of the electrically conductive counterelectrode layer 141 or of the poly layer with an effect on a critical dimension of the cutouts 220 (or of perforations).

Figure 6E:
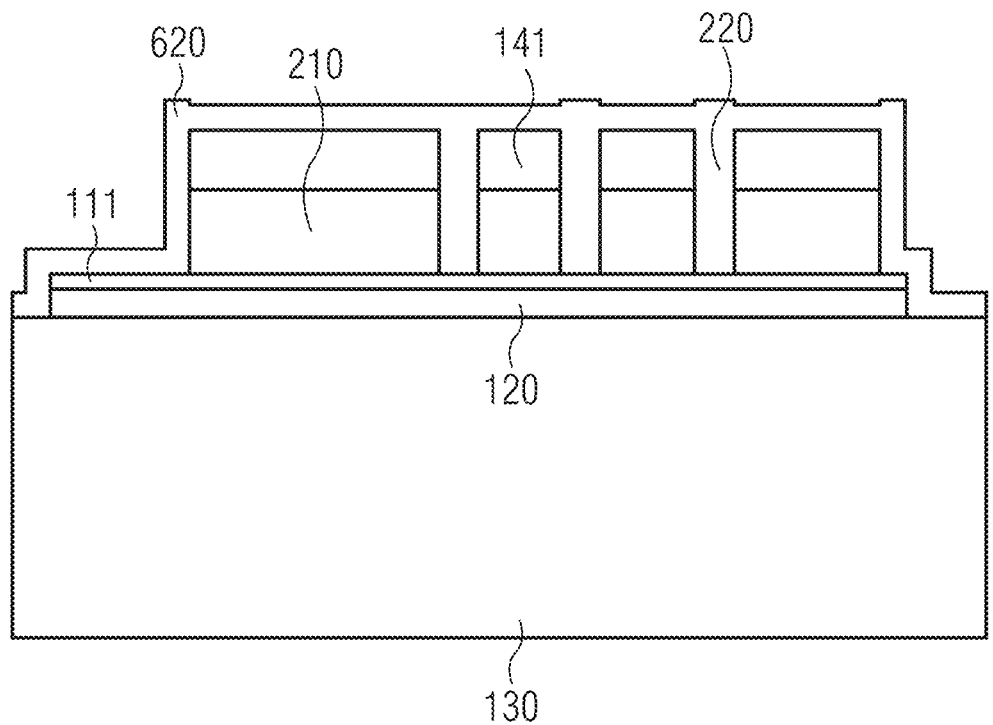

FIG. 6e shows a fifth process step for forming the membrane component 600. A metal layer 620 was deposited on the carrier substrate 130. By way of example, the metal layer 620 can be an aluminum layer. The metal (for example aluminum) of the metal layer 620 can for example penetrate into the cutouts 220 (for example perforations) and cover sidewalls of the mesas.

Figure 6F:
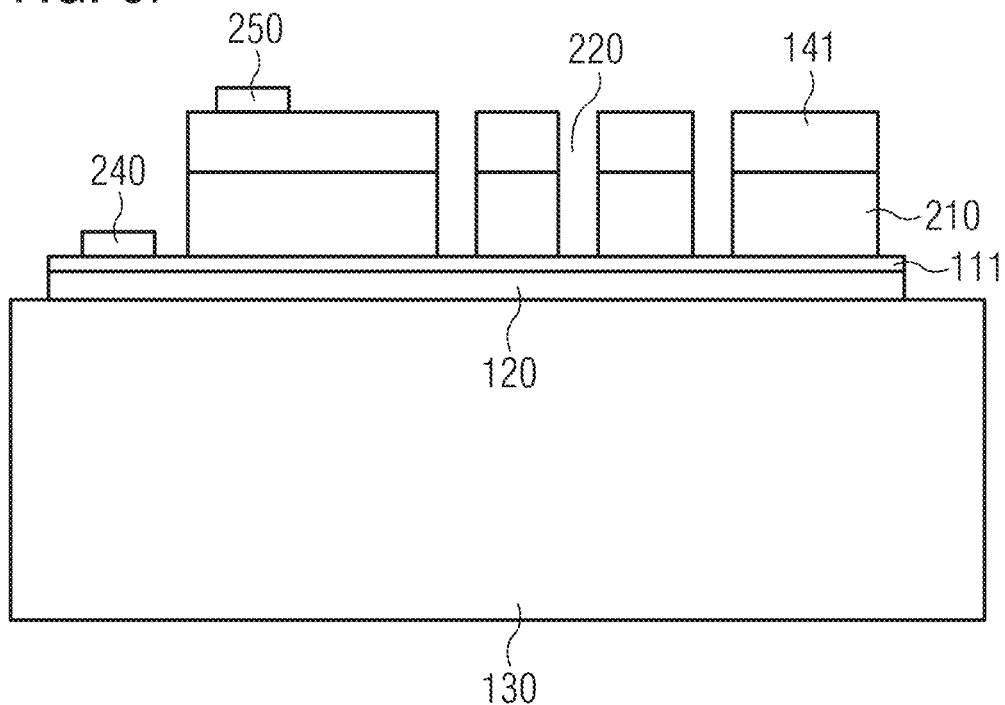

FIG. 6f shows a sixth process step for forming the membrane component 600. The deposited metal layer 620 was structured in order to form a first contact structure 240 at a surface of the electrically conductive membrane layer 111 and a second contact structure 250 at a surface of the electrically conductive counterelectrode layer 141. By way of example, the structuring of the deposited metal layer 620 can comprise isotropic etching (for example wet-chemical etching) of the deposited metal layer 620 (aluminum etching). The contact structures 240, 250 can form for example connection pads (for example for bond structures) for the electrical contacting of the electrically conductive membrane layer 111 and of the electrically conductive counterelectrode layer 141.

By way of example, a work set-up can comprise isotropic aluminum etching (for example by means of wet etching). A high reliability of the contact structures 240, 250 or of a metallization can be achieved in this case. In addition, a passivation can be omitted.

Figure 6G:
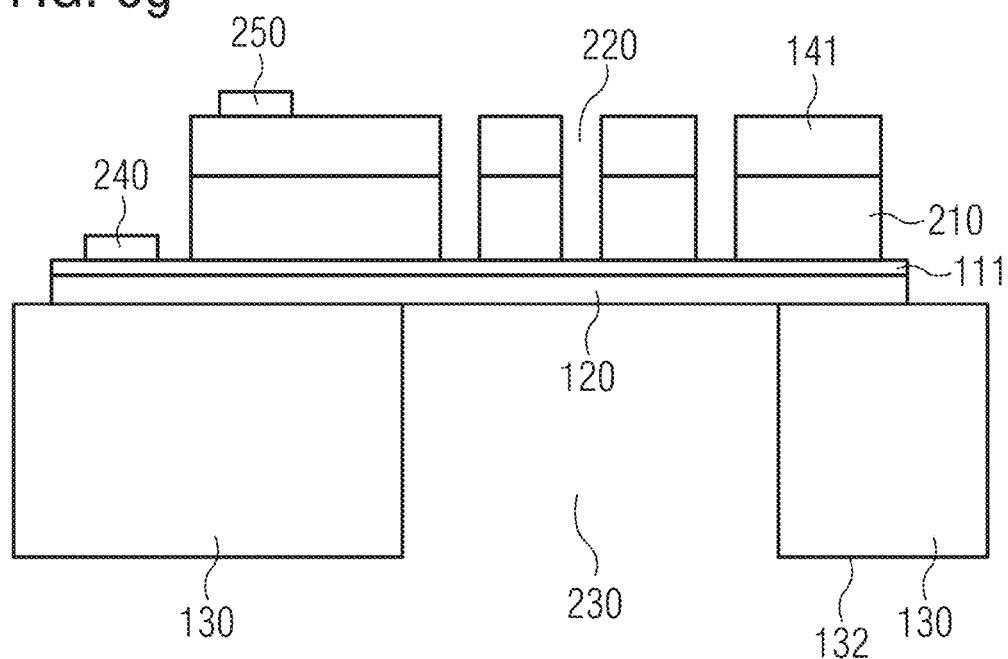

FIG. 6g shows a seventh process step for forming the membrane component 600. A cutout 230 was formed in the carrier substrate 130. By way of example, before the process of forming the cutout 230, a thickness of the carrier substrate 130 can be reduced to 350 µm (for example by grinding). By way of example, forming the cutout 230 can comprise reactive ion etching (referred to as "deep reactive ion etching", DRIE).

By way of example, it is possible to carry out a grinding film process over mesa edges. In this case, by way of example, at least the electrically conductive counterelectrode layer 141 can be arranged on a topography-tolerant film and a rear side 132 of the carrier substrate 130 can be ground.

By way of example, in a work set-up, a protective resist layer can be applied and a robust lamination/delamination process can be carried out.

Figure 6H:
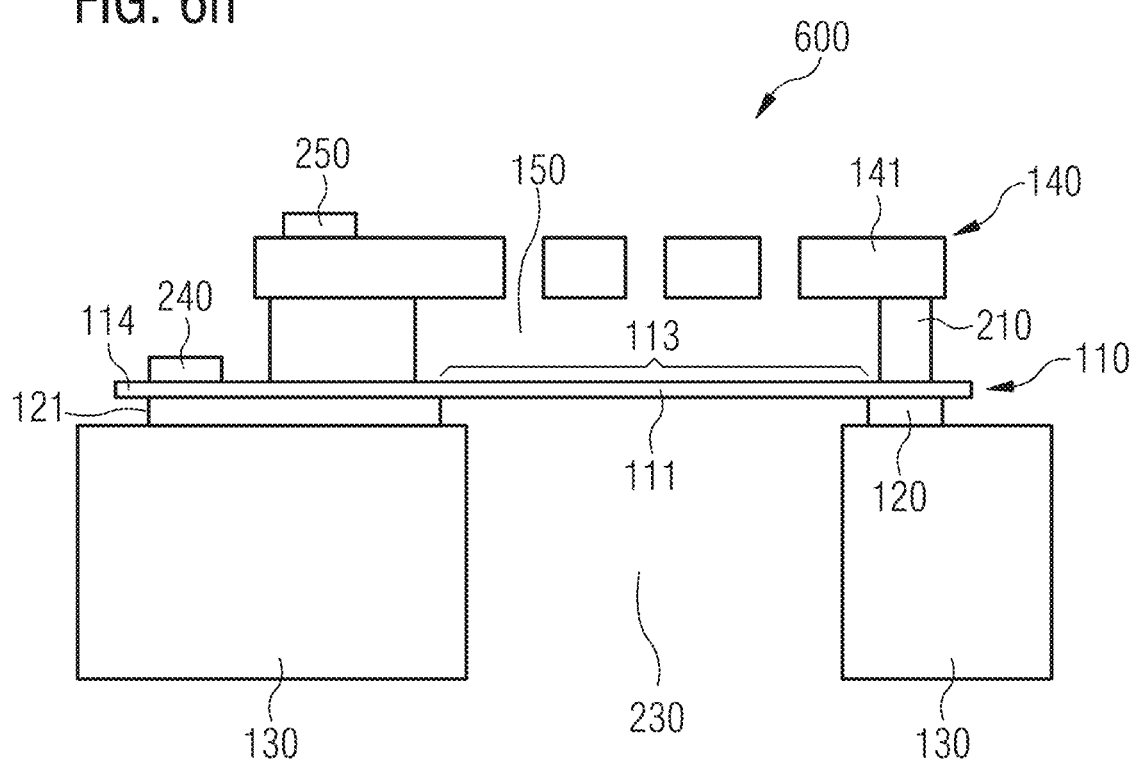

FIG. 6h shows an eighth process step for forming the membrane component 600. Between a counterelectrode structure 140, comprising the electrically conductive counterelectrode layer 141, and the electrically conductive membrane layer 111 of a membrane structure 110, a cavity 150 was formed by the second insulation layer 210 being partly removed. During the partial removal of the second insulation layer 210, an overhang of the electrically conductive membrane layer 111 over the first insulation layer 120 was additionally formed, such that an edge 114 of the electrically conductive membrane layer 111 projects laterally beyond an edge 121 of the first insulation layer 120. By way of example, the second insulation layer 210 can be partly removed by means of a hydrogen fluoride (HF) gas phase release process. A remaining part of the second insulation layer 210 forms a lateral boundary of the cavity 150. Afterward, by way of example, a perfluorodecyltrichlorosilane (FDTS) anti-stick layer can be deposited (for example on the electrically conductive membrane layer 111 and/or on the electrically conductive counterelectrode layer 141).

By way of example, formation of spacers or shock absorbers (referred to as "bumps") or sticking (for example of the electrically conductive membrane layer 111 to the electrically conductive counterelectrode layer 141) can be eliminated.

By way of example, in a work set-up, gas phase etching (for example rapidly and with only approximately 1 µm) and a self-assembled monolayer (SAM) coating (for example the FDTS anti-stick layer) can be carried out. In this case, the self-assembled monolayer coating can additionally serve as (potential) passivation.

FIGS. 6a to 6h show one example of a process sequence with a poly-poly arrangement without spacers or shock absorbers (referred to as "bumps"). By way of example, in the case of a poly-poly arrangement, both the electrically conductive membrane layer 111 and the electrically conductive counterelectrode layer 141 can be polysilicon layers.

By way of example, in the process sequence as many process steps as possible can be skipped in order to achieve a saving of costs. For this purpose, formation of spacers or shock absorbers can be avoided since the self-assembled monolayer coating (for example the FDTS anti-stick layer) can perform this task. This can be further optimized by process development. In addition, for this purpose it is possible to dispense with an undulation of the membrane structure 110 (for example vertical grooves and/or concentric rings for optimizing a tensile stress of the membrane region 113). In this case polysilicon loading engineering can be implemented. In addition, a segmentation of the counterelectrode structure 140 can be omitted. It is thereby possible to bring about an increased parasitic capacitance and thus a system limit for an average signal-to-noise ratio (SNR). Furthermore, for this purpose, pull-in testing of the membrane region 113 can be omitted. A dynamic wafer test on the basis of a resonance (for example a determination of a resonant frequency of the membrane structure 110) can be carried out instead. Sampling tests can be carried out in this case.

By way of example, the concept presented above can also be applied to other concepts for membrane components. By way of example, if the membrane structure 110 is arranged above the counterelectrode structure 140 or if the membrane is at the top, a similar or identical approach can be pursued and/or a similar process sequence can be carried out. In this case, chemical mechanical polishing can additionally be carried out. Moreover, in the case of a concept having a double counterelectrode structure (for example having a double backplate), a similar or identical approach can be pursued and/or a similar process sequence can be carried out. An additional layer (for example a second counterelectrode structure) can be formed in this case.

Further details and aspects will be mentioned in association with the embodiments described above or below. The embodiment shown in FIGS. 6a to 6h can comprise one or more optional additional features corresponding to one or more aspects mentioned in connection with the proposed concept or one or more of the embodiments described above (for example FIGS. 1-5) or below (for example FIGS. 7a-10).

FIGS. 7a to 7h show schematic process steps for forming a further membrane component 700. The process of forming the membrane component 700 can be carried out in a manner similar to the method 500 described in association with FIG. 5 and/or in a manner similar to the process sequence described in association with FIGS. 6a to 6h. In addition, the membrane component 700 can be configured like the membrane component 300 described in association with FIG. 3.

Figure 7A:
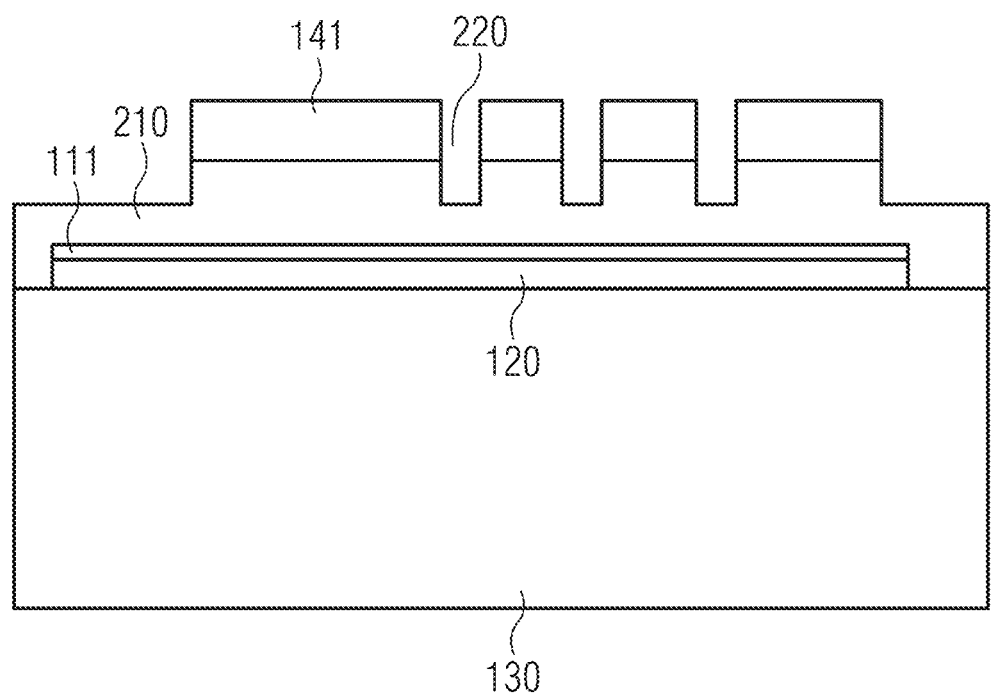
FIGS. 7a-7h show schematic process steps for forming a further membrane component.

The process step shown in FIG. 7a can be carried out in a manner similar to the process step described in association with FIG. 6d. On a carrier substrate 130, a structured first insulation layer 120 and a structured electrically conductive membrane layer 111 were formed. In addition, a structured second insulation layer 210 and a structured electrically conductive counterelectrode layer 141 were formed. In this case, three cutouts 220 were formed in the electrically conductive counterelectrode layer 141 and the second insulation layer 210. A depth of the cutouts 220 in the second insulation layer 210 is half of the vertical distance between the electrically conductive counterelectrode layer 141 and the electrically conductive membrane layer 111. By way of example, the structuring of the second insulation layer 210 and of the electrically conductive counterelectrode layer 141 can comprise etching of the electrically conductive counterelectrode layer 141 and (for example time-controlled) half etching of the second insulation layer 210 (for example half poly-TEOS etching). By way of example, the cutouts 220 can have a round or elliptic lateral cross section.

Figure 7B:
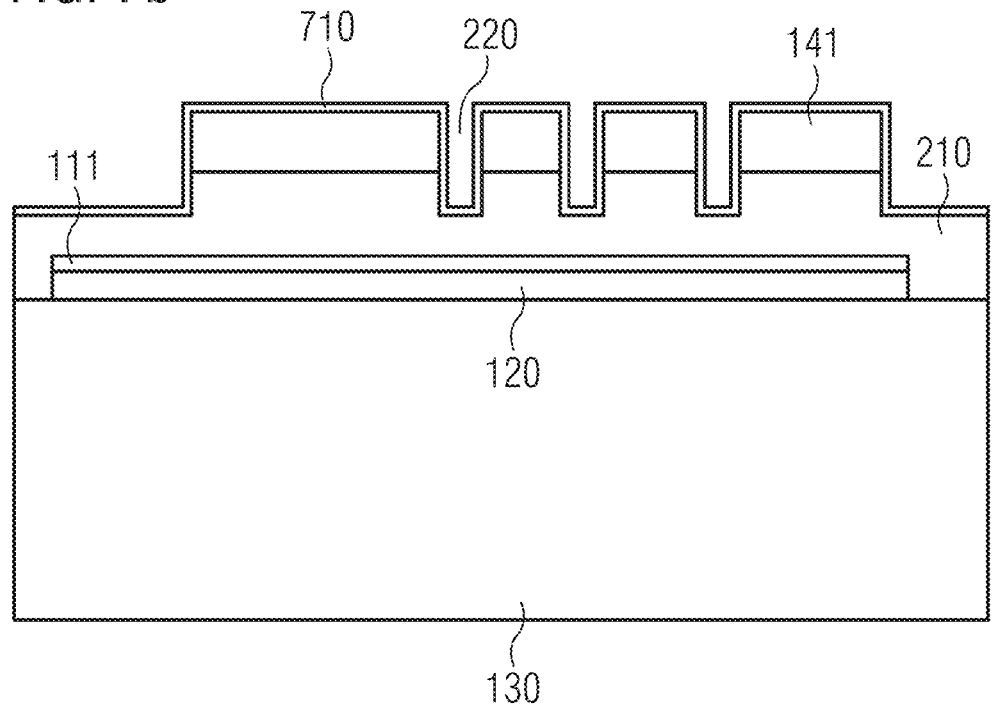

Afterward, as shown in FIG. 7b, a third insulation layer 710 is deposited. The third insulation layer 710 penetrates into the cutouts 220 and covers the walls thereof. By way of example, the insulation layer 710 can be a thin silicon nitride (Si3N4) layer having a thickness of 200 nm.

Figure 7C:
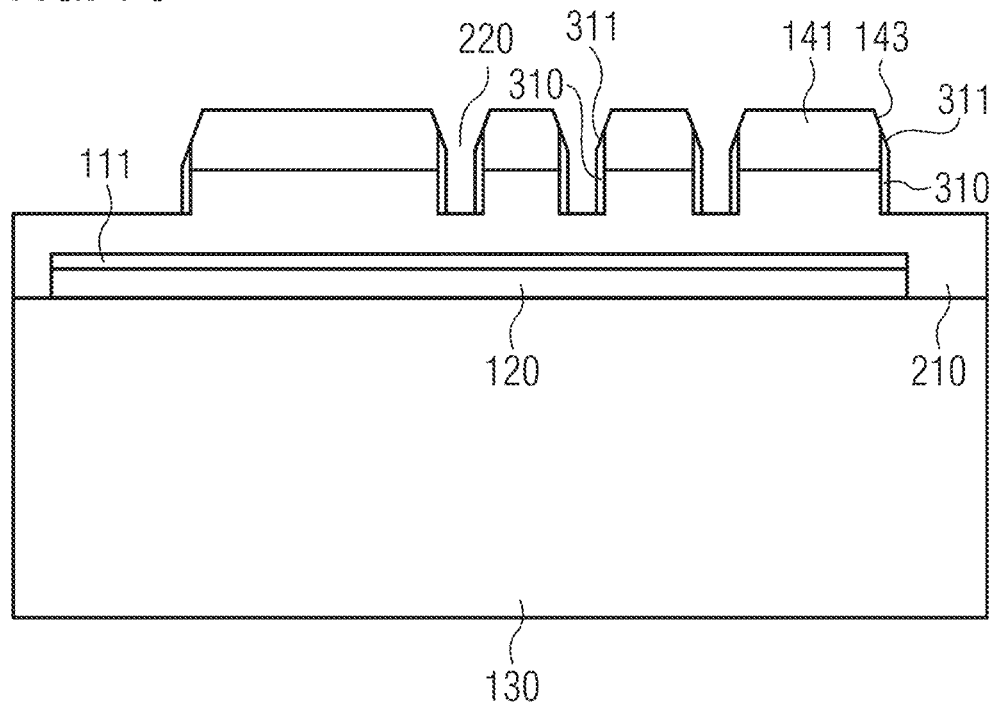

Subsequently, as shown in FIG. 7c, the deposited third insulation layer 710 is partly removed in order to form insulation structures 310. The insulation structures 310 are arranged at walls of the cutouts 220. In addition, insulation structures 310 are arranged at the edges of the electrically conductive counterelectrode layer 141. Partly removing the third insulation layer 710 can be carried out by means of an etching process (for example by means of Si3N4 spacer etching). In this case, edges 143 of the electrically conductive counterelectrode layer 141 and edges 311 of the insulation structures 310 can be chamfered or rounded.

Figure 7D:
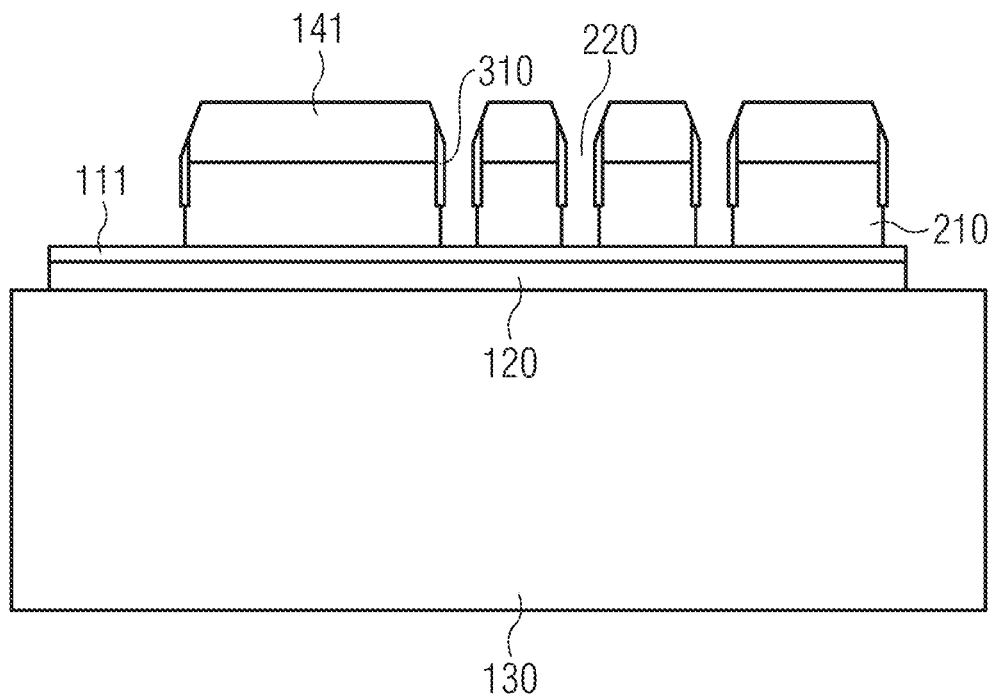
Figure 7E:
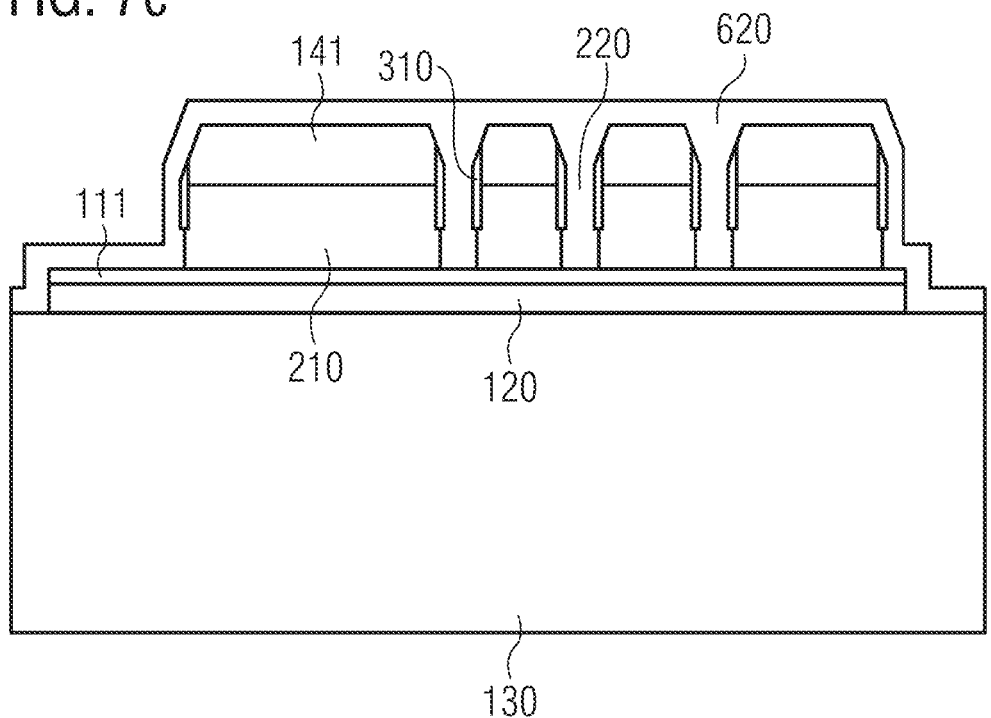

In a subsequent process step, as shown in FIG. 7d, the cutouts 220 are deepened as far as the electrically conductive membrane layer 111 (for example by means of complete TEOS etching). Subsequently, as shown in FIG. 7e, a metal layer 620 (for example an aluminum layer) is deposited. In this case, the metal layer 620 penetrates into the cutouts 220. By way of example, a material of the metal layer 620 (for example aluminum) can enter the cutouts 220 (for example perforations) and cover side walls of the mesas.

Figure 7F:
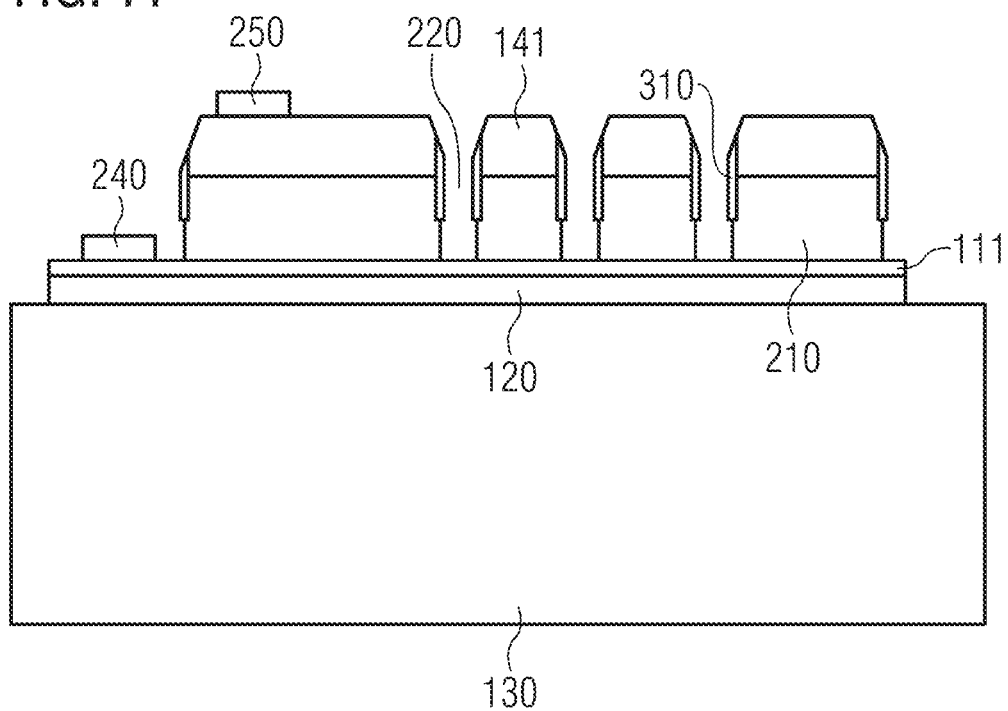

Afterwards, as shown in FIG. 7f, the deposited metal layer 620 is structured in order to form a first contact structure 240 at a surface of the electrically conductive membrane layer 111 and a second contact structure 250 at a surface of the electrically conductive counterelectrode layer 141. By way of example, the structuring of the deposited metal layer 620 can comprise isotropic etching (for example wet-chemical etching) of the deposited metal layer 620 (for example aluminum etching). The contact structures 240, 250 can form for example connection pads (for example for bond structures) for the electrical contacting of the electrically conductive membrane layer 111 and of the electrically conductive counterelectrode layer 141.

By way of example, a work set-up can comprise isotropic aluminum etching (for example by means of wet etching). A high reliability of the contact structures 240, 250 or of a metallization can be achieved in this case. In addition, a passivation can be omitted.

Figure 7G:
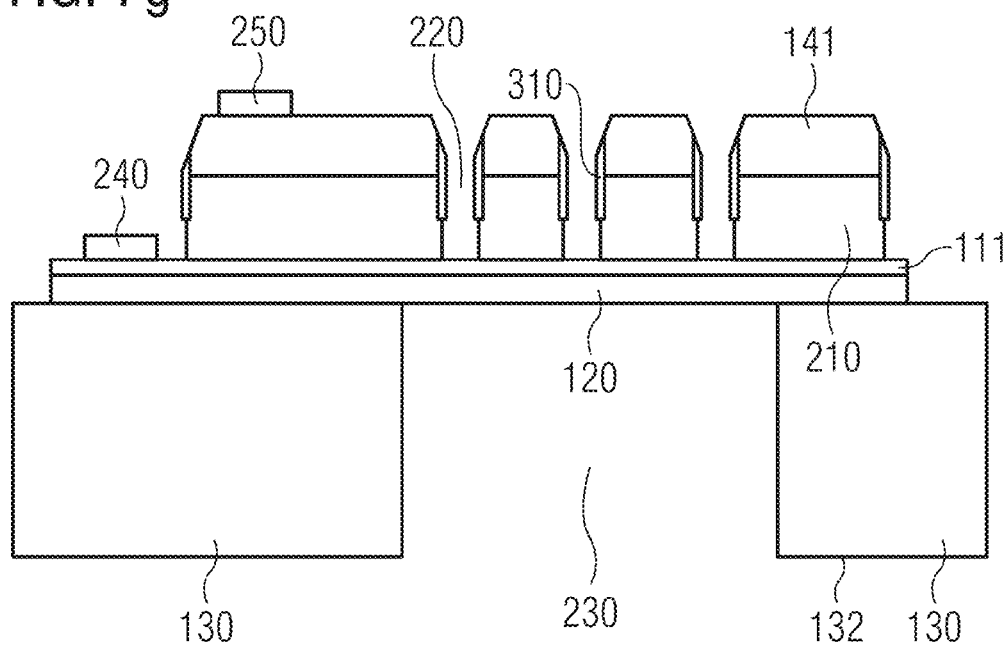

Afterward, as shown in FIG. 7g, a cutout 230 is formed in the carrier substrate 130. By way of example, before the process of forming the cutout 230, a thickness of the carrier substrate 130 can be reduced to 350 µm (for example by grinding). By way of example, forming the cutout 230 can comprise reactive ion etching (referred to as "deep reactive ion etching", DRIE).

By way of example, it is possible to carry out a grinding film process over mesa edges. In this case, by way of example, at least the electrically conductive counterelectrode layer 141 can be arranged on a topography-tolerant film and a rear side 132 of the carrier substrate 130 can be ground.

By way of example, in a work set-up, a protective resist layer can be applied and a robust lamination/delamination process can be carried out.

Figure 7H:
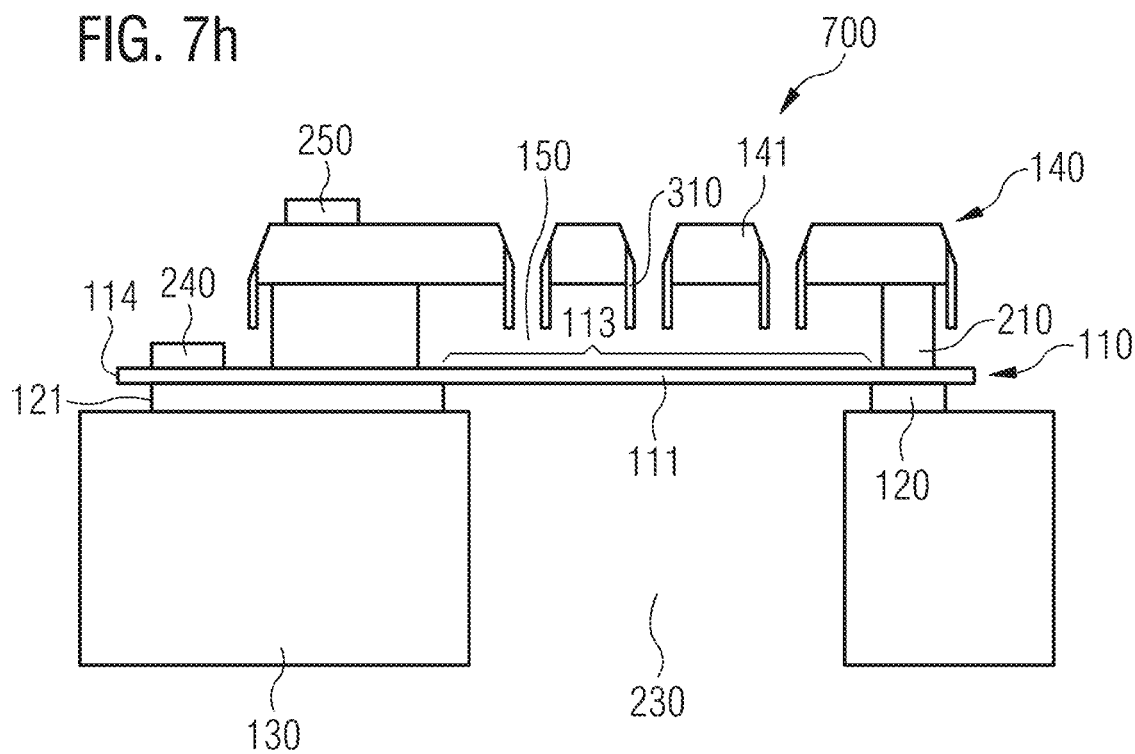

In a subsequent process step as shown in FIG. 7h, between a counterelectrode structure 140, comprising the electrically conductive counterelectrode layer 141, and the electrically conductive membrane layer 111 of a membrane structure 110, a cavity 150 is formed by the second insulation layer 210 being partly removed. During the partial removal of the second insulation layer 210, an overhang of the electrically conductive membrane layer 111 over the first insulation layer 120 is additionally formed, such that an edge 114 of the electrically conductive membrane layer 111 projects laterally beyond an edge 121 of the first insulation layer 120. By way of example, the second insulation layer 210 can be partly removed by means of a hydrogen fluoride (HF) gas phase release process. A remaining part of the second insulation layer 210 forms a lateral boundary of the cavity 150.

By way of example, the insulation structures 310 (for example silicon nitride cylinder profiles), which are applied to the cutouts 220 (for example perforation holes) and extend into the cavity, can serve as anti-stick shock absorbers.

FIGS. 7a to 7h show one example of a process sequence with a poly-poly arrangement with spacers or shock absorbers (referred to as "bumps"). By way of example, in the case of a poly-poly arrangement, both the electrically conductive membrane layer 111 and the electrically conductive counterelectrode layer 141 can be polysilicon layers.

Further details and aspects will be mentioned in association with the embodiments described above or below. The embodiment shown in FIGS. 7a to 7h can comprise one or more optional additional features corresponding to one or more aspects mentioned in connection with the proposed concept of one or more of the embodiments described above (for example FIGS. 1-6h) or below (for example FIGS. 8-10).

Figure 8:
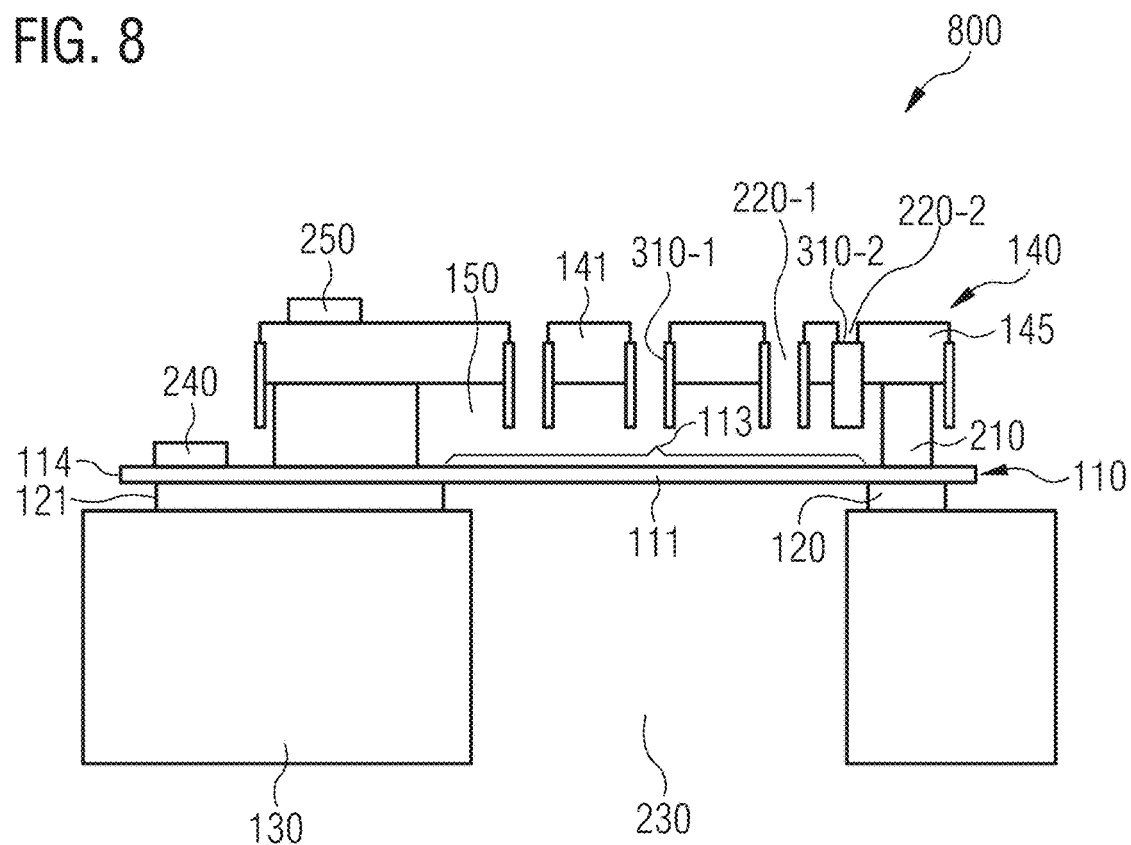
FIG. 8 shows a schematic cross section of a further membrane component.

FIG. 8 shows a schematic cross section of a further membrane component 800. The membrane component 800 can be configured in a manner similar to the membrane component 700 described in association with FIGS. 7a to 7h. The electrically conductive counterelectrode layer 141 has a plurality of wide cutouts 220-1 and one narrow cutout 220-2. The cutout 220-2 is so narrow that in the process steps shown in FIGS. 7b and 7c, in the cutout 220-2, rather than two insulation structures 310-1 spaced apart from one another, a single insulation structure 310-2 is formed, which laterally fills the cutout 220-2. As a result, a part 145 of the electrically conductive counterelectrode layer 141 can be electrically isolated in order to form a potential-free region (referred to as "floating region"). In this case, the part 145 of the electrically conductive counterelectrode layer 141 can be mechanically connected to a remainder of the electrically conductive counterelectrode layer 141 via the insulation structure 310-2.

FIG. 8 shows one example of a process sequence with a poly-poly arrangement with spacers or shock absorbers (referred to as "bumps") and with an option for the segmentation of the counterelectrode structure 140 (for example with an option for backplate segmentation). By way of example, in the case of a poly-poly arrangement, both the electrically conductive membrane layer 111 and the electrically conductive counterelectrode layer 141 can be polysilicon layers.

By way of example, if the cutout 220-2 (or a structuring) of the counterelectrode structure 140 (for example of a backplate) forms a slot having a width of less than twice the thickness of the third insulation layer 710 (for example a spacer-bump layer), the third insulation layer 710 can form a connecting bridge along the slot. It is thereby possible to achieve an electrical isolation of the counterelectrode structure 140 or of the electrically conductive counterelectrode layer 141 (for example of a polysilicon backplate layer).

Further details and aspects will be mentioned in association with the embodiments described above or below. The embodiment shown in FIG. 8 can comprise one or more optional additional features corresponding to one or more aspects mentioned in connection with the proposed concept or one or more of the embodiments described above (for example FIGS. 1-7h) or below (for example FIGS. 9a-10).

FIGS. 9a to 9h show schematic process steps for forming a further membrane component 900. The process of forming the membrane component 900 can be carried out in a manner similar to the method 500 described in association with FIG. 5, in a manner similar to the process sequence described in association with FIGS. 6a to 6h and/or in a manner similar to the process sequence described in association with FIGS. 7a to 7h. In addition, the membrane component 900 can be configured like the membrane component 300 described in association with FIG. 3.

Figure 9A:
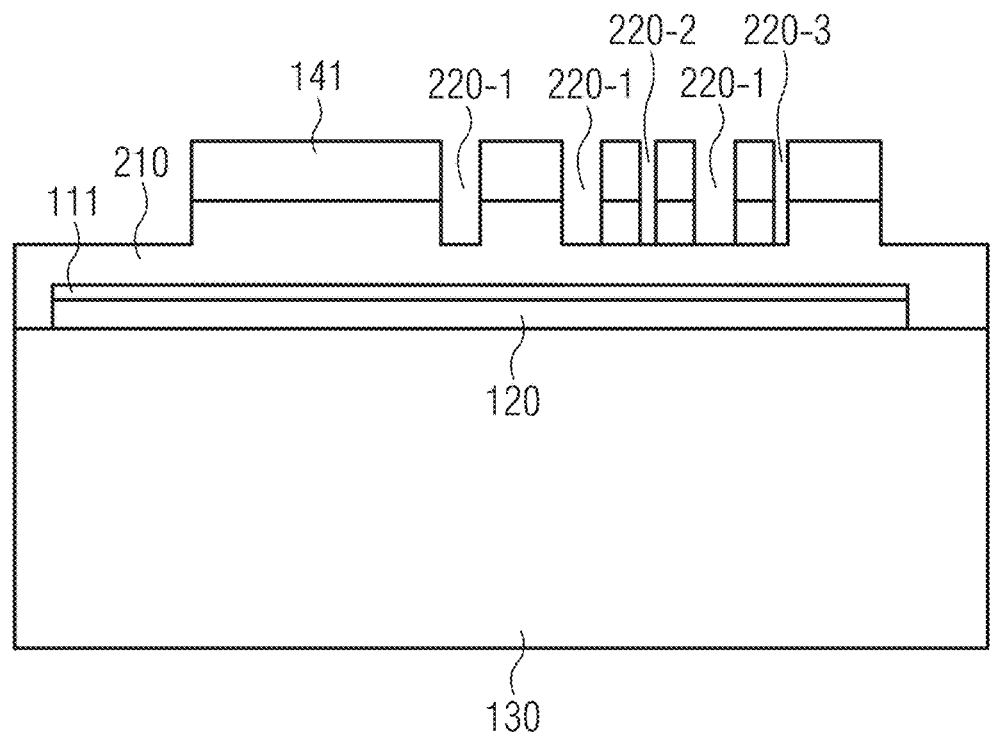

The process step shown in FIG. 9a can be carried out in a manner similar to the process step described in association with FIG. 7a. On a carrier substrate 130, a structured first insulation layer 120 was formed, as was a structured electrically conductive membrane layer 111. In addition, a structured second insulation layer 210 and a structured electrically conductive counterelectrode layer 141 were formed. In this case, wide cutouts 220-1 and narrow cutouts 220-2, 220-3 were formed in the electrically conductive counterelectrode layer 141 and the second insulation layer 210. By way of example, the cutout 220-2 can be a narrow hole for a spacer or shock absorber (referred to as "bump") and the cutout 220-3 can be a narrow slot for a segmentation. A depth of the cutouts 220 in the second insulation layer 210 is half of the vertical distance between the electrically conductive counterelectrode layer 141 and the electrically conductive membrane layer 111. By way of example, the structuring of the second insulation layer 210 and of the electrically conductive counterelectrode layer 141 can comprise etching of the electrically conductive counterelectrode layer 141 and (for example time-controlled) half etching of the second insulation layer 210 (for example half poly-TEOS etching).

Figure 9B:
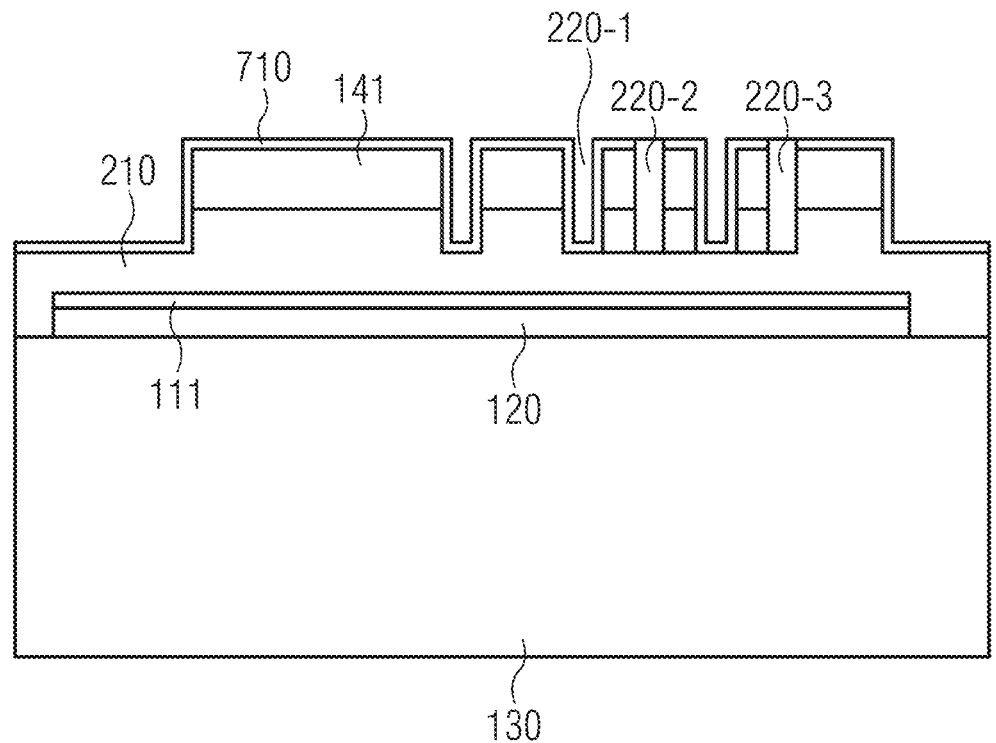

Afterward, as shown in FIG. 9b, a third insulation layer 710 is deposited. The third insulation layer 710 penetrates into the cutouts 220 and covers the walls thereof. By way of example, the insulation layer 710 can be a thin silicon nitride (Si3N4) layer having a thickness of 200 nm. The third insulation layer 710 completely fills the narrow cutouts 220-2, 220-3.

Figure 9C:
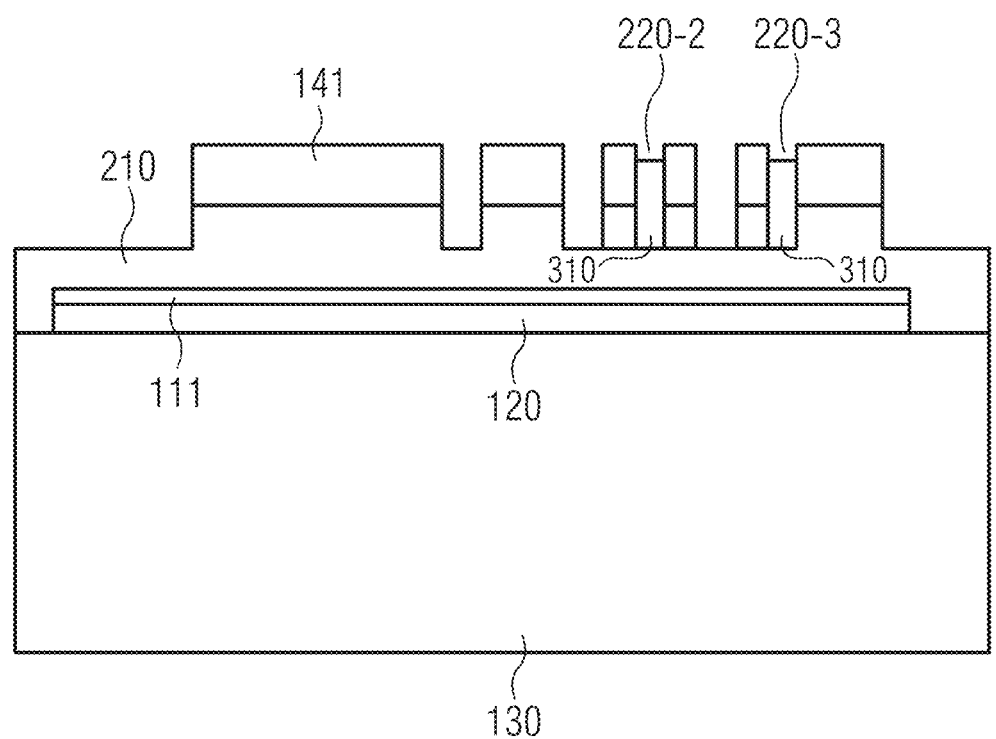

Subsequently, as shown in FIG. 9c, the deposited third insulation layer 710 (for example a silicon nitride (Si3N4) layer) is partly removed in order to form insulation structures 310. The insulation structures 310 are arranged in the cutouts 220-2, 220-3. Partly removing the third insulation layer 710 can comprise an etching process or an isotropic Si3N4 removal.

Figure 9D:
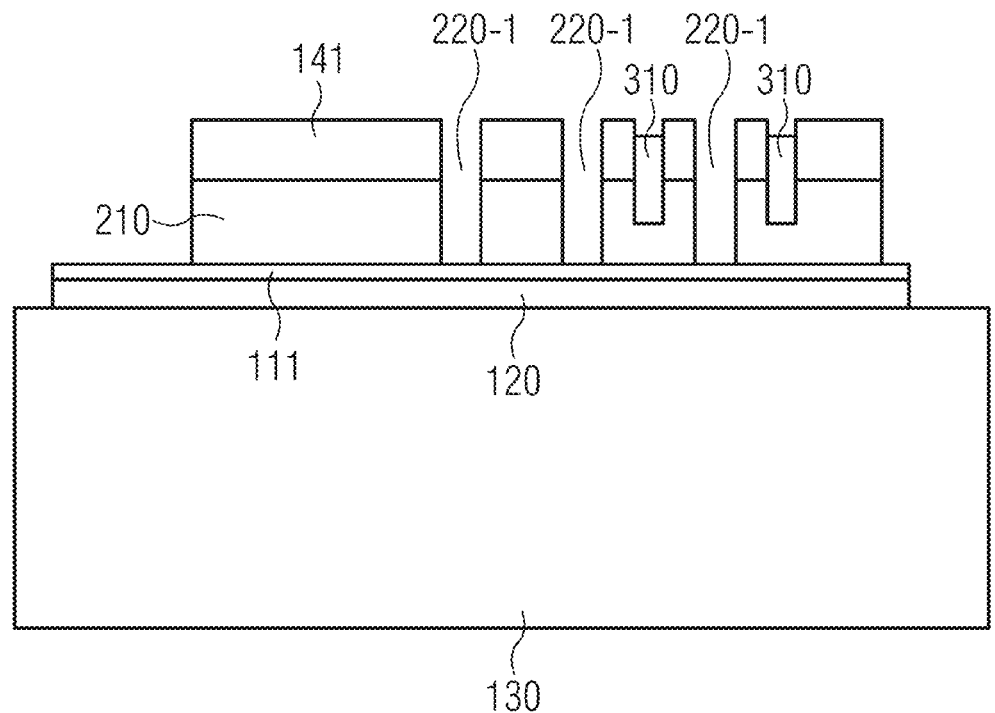
Figure 9E:
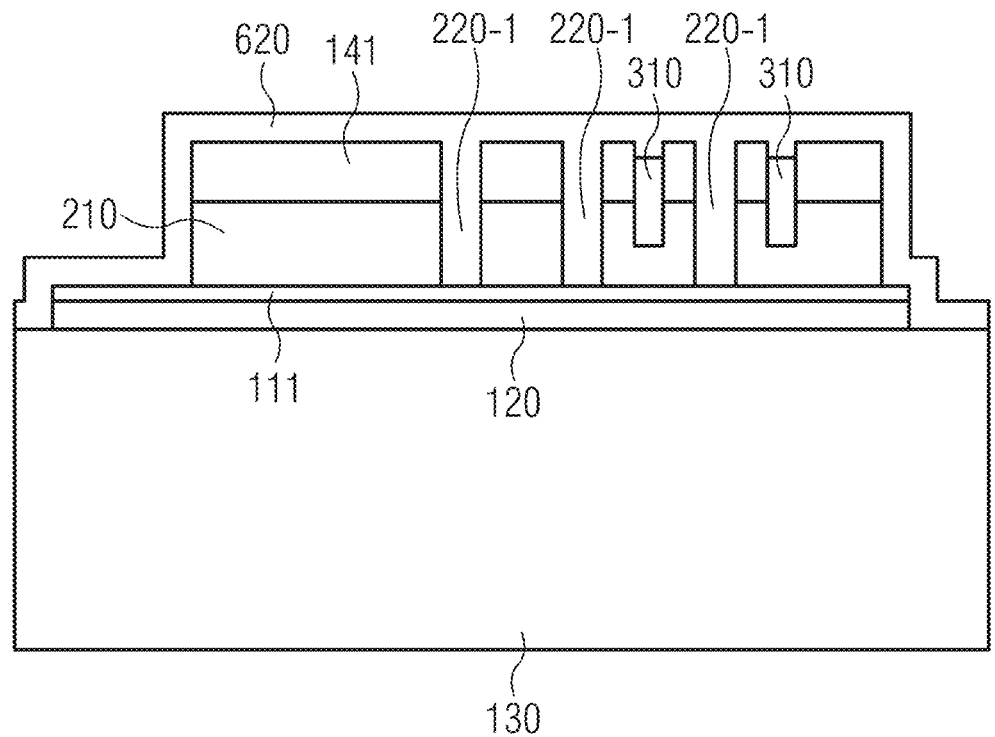

In a subsequent process step, as shown in FIG. 9d, the cutouts 220-1 are deepened as far as the electrically conductive membrane layer 111 (for example by means of complete TEOS etching). Subsequently, as shown in FIG. 9e, a metal layer 620 (for example an aluminum layer) is deposited. In this case, the metal layer 620 penetrates into the cutouts 220-1. By way of example, a material of the metal layer 620 (for example aluminum) can enter the cutouts 220-1 (for example perforations) and sidewalls of the mesas.

Figure 9F:
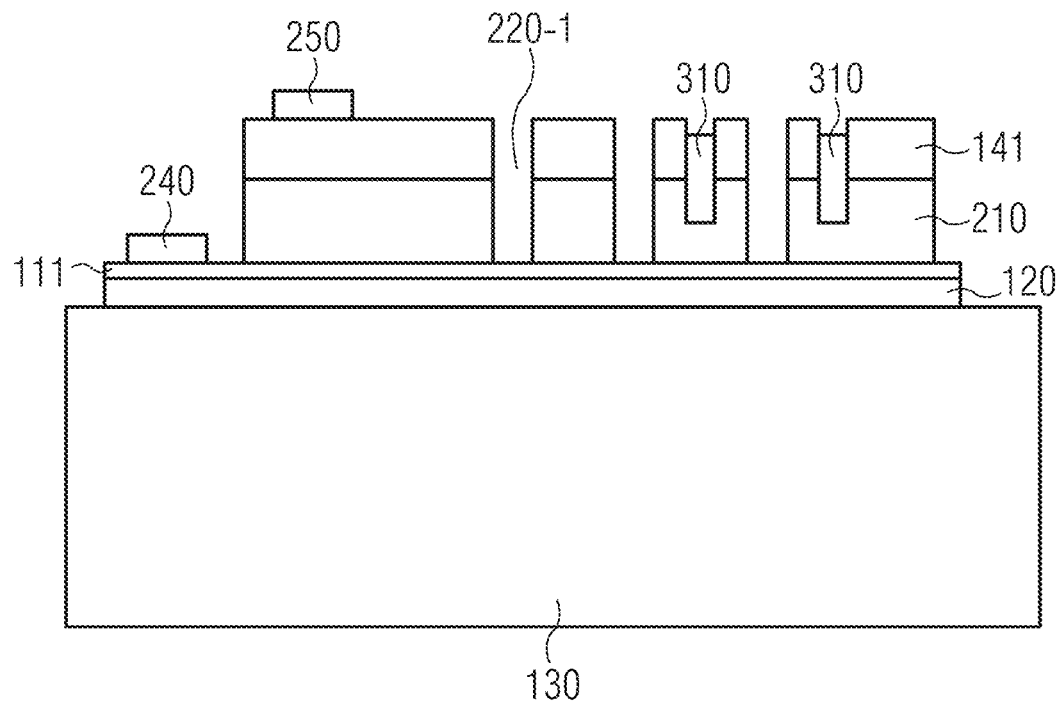

Afterward, as shown in FIG. 9f, the deposited metal layer 620 is structured in order to form a first contact structure 240 at a surface of the electrically conductive membrane layer 111 and a second contact structure 250 at a surface of the electrically conductive counterelectrode layer 141. By way of example, the structuring of the deposited metal layer 620 can comprise isotropic etching (for example wet-chemical etching) of the deposited metal layer 620 (for example aluminum etching). The contact structures 240, 250 can form for example connection pads (for example for bond structures) for the electrical contacting of the electrically conductive membrane layer 111 and of the electrically conductive counterelectrode layer 141.

By way of example, a work set-up can comprise isotropic aluminum etching (for example by means of wet etching). A high reliability of the contact structures 240, 250 or of a metallization can be achieved in this case. In addition, a passivation can be omitted.

Figure 9G:
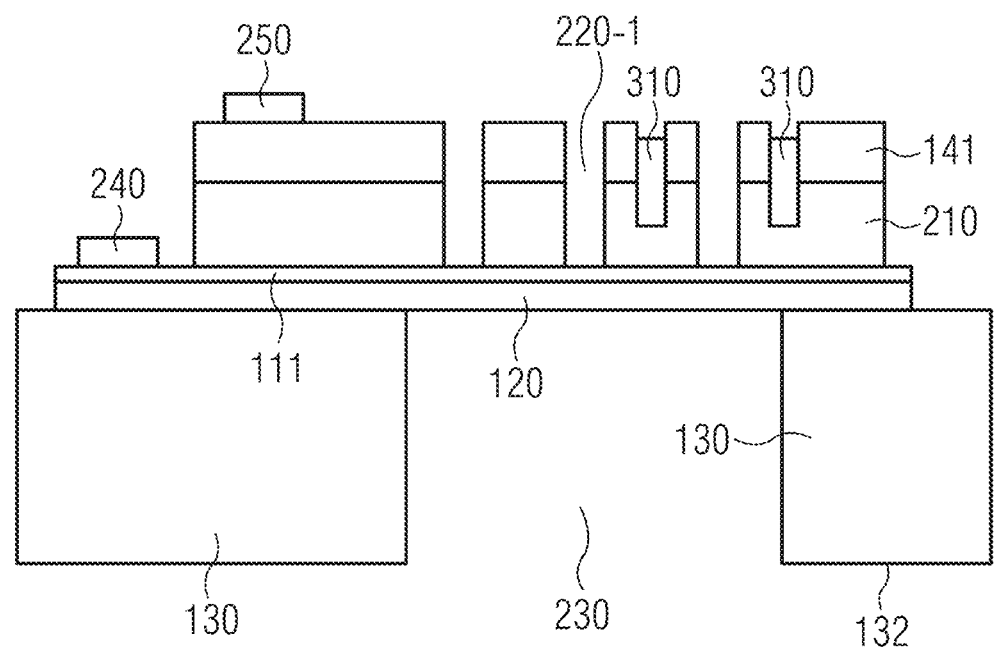

Afterward, as shown in FIG. 9g, a cutout 230 is formed in the carrier substrate 130. By way of example, before the process of forming the cutout 230, a thickness of the carrier substrate 130 can be reduced to 350 μm (for example by grinding). By way of example, forming the cutout 230 can comprise reactive ion etching (referred to as "deep reactive ion etching", DRIE).

By way of example, it is possible to carry out a grinding film process over mesa edges. In this case, by way of example, at least the electrically conductive counterelectrode layer 141 can be arranged on a topography-tolerant film and a rear side 132 of the carrier substrate 130 can be ground.

In a subsequent process step as shown in FIG. 9h, between a counterelectrode structure 140, comprising the electrically conductive counterelectrode layer 141, and the electrically conductive membrane layer 111 of a membrane structure 110, a cavity 150 is formed by the second insulation layer 210 being partly removed. During the partial removal of the second insulation layer 210, an overhang of the electrically conductive membrane layer 111 over the first insulation layer 120 is additionally formed, such that an edge 114 of the electrically conductive membrane layer 111 projects laterally beyond an edge 121 of the first insulation layer 120. By way of example, the second insulation layer 210 can be partly removed by means of a hydrogen fluoride (HF) gas phase release process. A remaining part of the second insulation layer 210 forms a lateral boundary of the cavity 150.

By way of example, the insulation structure 310-1 can form a spacer or shock absorber. The insulation structure 310-2 can for example electrically isolate a part 145 of the electrically conductive counterelectrode layer 141 from a remainder of the electrically conductive counterelectrode layer 141 in order to form a region having an indefinite potential (referred to as "floating region"). In this case, the part 145 of the electrically conductive counterelectrode layer 141 can be mechanically connected to the remainder of the electrically conductive counterelectrode layer 141 via the insulation structure 310-2.

FIGS. 9a to 9h show one example of a process sequence with a poly-poly arrangement with spacers or shock absorbers (referred to as "bumps") and with a segmentation of the counterelectrode structure 140 (for example with a segmentation of or by silicon nitride (Si3N4)). By way of example, in the case of a poly-poly arrangement, both the electrically conductive membrane layer 111 and the electrically conductive counterelectrode layer 141 can be polysilicon layers.

By way of example, the insulation structure 310-1 can form a silicon nitride (Si3N4) spacer or a silicon nitride (Si3N4) shock absorber.

Further details and aspects will be mentioned in association with the embodiments described above or below. The embodiment shown in FIGS. 9a to 9h can comprise one or more optional additional features corresponding to one or more aspects mentioned in connection with the proposed concept of one or more of the embodiments described above (for example FIGS. 1-8) or below (for example FIG. 10).

FIG. 10 shows a schematic cross section of a further membrane component 1000. The membrane component can be configured in a manner similar to the membrane component 400 described in association with FIG. 4 and/or in a manner similar to the membrane component 600 described in association with FIGS. 6a to 6h. In contrast to the membrane component 600 shown in FIG. 6h, the electrically conductive counterelectrode layer 141 of the membrane component 1000 is a metal layer (for example an aluminum layer). As a result, the second contact structure 250 for the electrical contacting (for example by means of a bond structure) of the electrically conductive counterelectrode layer 141 can be omitted.

FIG. 10 shows an example of an option for further simplification of the membrane component. In this case, a metallization can also be used for the electrically conductive counterelectrode layer 141 (for example a static backplate). This can lead to a 3-layer technology. In this case, the three layers can be the electrically conductive membrane layer 111 (for example a membrane), the electrically conductive counterelectrode layer 141 (for example a backplate with connection pad) and a cavity 150. A varying mechanical behavior of the electrically conductive counterelectrode layer 141 (for example of a backplate) can be brought about as a result. By way of example, a large CT mismatch with respect to silicon can occur. In addition, a potential compressive stress can be generated. Furthermore, a lower mechanical stiffness can be brought about.

Further details and aspects will be mentioned in association with the embodiments described above or below. The embodiment shown in FIG. 10 can comprise one or more optional additional features corresponding to one or more aspects mentioned in connection with the proposed concept or one or more of the embodiments described above (for example FIGS. 1-9h) or below.

Some embodiments relate to a cost-effective (for example an ultra-low-cost (ULC)) MEMS microphone.

Some embodiments relate to a cost-effective four-layer microphone.

In accordance with one aspect, the membrane component can be an element of a regular MEMS microphone system or form a regular MEMS microphone system.

In accordance with one aspect, the membrane component can be a silicon (Si) MEMS microphone having a minimum number of photolayers.

In accordance with one aspect, each function of the membrane component (for example of a microphone) can relate to a lithography step.

In accordance with one aspect, with a membrane and stator structuring it is also possible for an underlying sacrificial layer to be etched.

In accordance with one aspect, an MEMS component can be cost-sensitive for an (end) product.

In accordance with one aspect, forming a MEMS component can comprise a large number of process steps, including more than 10 lithography layers, wherein the costs can add up.

Some embodiments of the present invention advantageously provide for more cost-effective membrane components having a longer lifetime and/or improved electrical properties.

The features disclosed in the description above, the following claims and the accompanying figures may be of importance and implemented both individually and in any desired combination for the realization of an exemplary embodiment in the various configurations thereof.

Although some aspects have been described in association with a device, it goes without saying that these aspects also constitute a description of the corresponding method, such that a block or a component of a device should also be understood as a corresponding method step or as a feature of a method step. Analogously thereto, aspects that have been described in association with or as a method step also constitute a description of a corresponding block or detail or feature of a corresponding device.

Generally, exemplary embodiments of the present invention may be implemented as a program, firmware, a computer program or a computer program product comprising a program code or as data, wherein the program code or the data is or are effective for carrying out one of the methods when the program runs on a processor or a programmable hardware component. The program code or the data may for example also be stored on a machine readable carrier or data carrier. The program code or the data may be present, inter alia, as source code, machine code or byte code and as other intermediate code. The data carrier may be a digital storage medium, a magnetic storage medium, for example a floppy disk, a magnetic tape, or a hard disk, or an optically readable digital storage medium. A programmable hardware component may be formed by a processor, a central processing unit (CPU), a graphics processing unit (GPU), a computer, a computer system, an application specific integrated circuit (ASIC), an integrated circuit (IC), a system on chip (SOC), a programmable logic element or a field programmable gate array (FPGA) with a microprocessor.

Only the principles of the disclosure are presented by the description and drawings. It therefore goes without saying that the person skilled in the art may derive different arrangements which, even though they are not expressly described or illustrated here, embody the principles of the disclosure and are contained in the essence and scope of protection thereof. Furthermore, all examples presented here are intended to be used, in principle, only for teaching purposes in order to assist the reader in understanding the principles of the disclosure and the concepts contributed by the inventor(s) for further development of the art, and should be interpreted as serving not to limit such specially presented examples and conditions. Furthermore, all statements herein regarding principles, aspects and examples of the disclosure as well as particular examples thereof are intended to encompass the equivalents thereof.

A block diagram may for example illustrate a conceptual view of an exemplary circuit embodied by the principles of the disclosure. In a similar manner it goes without saying that all flow charts, flow diagrams, state transition diagrams, pseudo code and the like represent various processes which are substantially represented in a computer readable medium and thus implemented by a computer or processor, irrespective of whether such a computer or processor is expressly illustrated. The methods disclosed in the description or in the claims may be carried out by means of a device comprising means for carrying out each of the respective steps of said methods.

Furthermore, it goes without saying that the disclosure of multiple actions or functions disclosed in the description or the claims should not be interpreted as being in the specific order. The disclosure of multiple actions or functions therefore does not limit them to a specific order, unless said actions or functions are not interchangeable for technical reasons. Furthermore, in some examples, a single action may include or be broken down into a plurality of sub actions. Such sub actions may be included and form part of the disclosure of said single action, provided that they are not expressly excluded.

Furthermore, the following claims are hereby incorporated in the detailed description, where each claim may represent a separate example by itself. If each claim may represent a separate example by itself, it should be noted that—even though in the claims a dependent claim may refer to a particular combination with one or more other claims—other examples may also include a combination of the dependent claim with the subject matter of any other dependent or independent claim. These combinations are proposed here, provided that there is no indication that a specific combination is not intended. Furthermore, features of a claim are also intended to be included for any other independent claim, even if said claim is not made directly dependent on the independent claim.

What is claimed is:

1. A method for forming a membrane component, comprising:

forming an electrically conductive membrane layer of a membrane structure on an insulation layer, wherein the electrically conductive membrane layer has a suspension region and a membrane region, and wherein the insulation layer is arranged on a carrier substrate;

forming a counterelectrode structure laterally at least in a region of the electrically conductive membrane layer; and forming a cavity arranged vertically between the counterelectrode structure and the membrane region of the electrically conductive membrane layer, such that the cavity extends vertically from an electrically conductive counterelectrode layer of the counterelectrode structure as far as the membrane region of the electrically conductive membrane layer, wherein an edge of the electrically conductive membrane layer projects beyond an edge of the insulation layer by more than half of a vertical distance between the electrically conductive membrane layer and the counterelectrode structure.

2. The method as claimed in claim 1, furthermore comprising:

forming a second insulation layer on the membrane structure, wherein forming the counterelectrode structure is effected on the second insulation layer; and forming a cutout in the counterelectrode structure, wherein the cutout penetrates vertically through the counterelectrode structure.

3. The method as claimed in claim 2, wherein the cutout extends into the second insulation layer, and wherein the cutout ends at a vertical distance from the counterelectrode structure of less than 75% of a thickness of the second insulation layer.

4. The method as claimed in claim 2, wherein the cutout divides the electrically conductive counterelectrode layer into at least two parts electrically insulated from one another.

5. The method as claimed in claim 2, furthermore comprising forming a third insulation layer at least one wall of the cutout of the counterelectrode structure.

6. The method as claimed in claim 5, wherein a material of the second insulation layer and a material of the third insulation layer are different.

7. The method as claimed in claim 5, furthermore comprising partly removing the third insulation layer, such that a remaining part of the third insulation layer forms an insulation structure, wherein at least a first part of the insulation structure is arranged at least one part of the wall of the cutout of the counterelectrode structure.

8. The method as claimed in claim 2, wherein forming the cavity comprises removing the second insulation layer laterally in a region of the membrane region of the electrically conductive membrane layer, and wherein a lateral overhang of the electrically conductive membrane layer over the insulation layer is formed while forming the cavity.

9. The method as claimed in claim 1, further comprising jointly forming a first contact structure at the suspension region of the electrically conductive membrane layer and a second contact structure at the electrically conductive counterelectrode layer.

\* \* \* \* \*